(12) United States Patent
Li et al.

(10) Patent No.: US 12,274,128 B2
(45) Date of Patent: Apr. 8, 2025

(54) DISPLAY SUBSTRATE AND METHOD FOR MANUFACTURING SAME, AND DISPLAY APPARATUS

(71) Applicants: Hefei BOE Joint Technology Co., Ltd., Anhui (CN); BOE Technology Group Co., Ltd., Beijing (CN)

(72) Inventors: Yongqian Li, Beijing (CN); Can Yuan, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 478 days.

(21) Appl. No.: 17/787,943

(22) PCT Filed: Aug. 5, 2021

(86) PCT No.: PCT/CN2021/110760
§ 371 (c)(1),
(2) Date: Jun. 22, 2022

(87) PCT Pub. No.: WO2022/057491
PCT Pub. Date: Mar. 24, 2022

(65) Prior Publication Data
US 2023/0021680 A1 Jan. 26, 2023

(30) Foreign Application Priority Data
Sep. 16, 2020 (CN) .................. 202010972329.X

(51) Int. Cl.
*H01L 27/14* (2006.01)
*H01L 27/12* (2006.01)
(Continued)

(52) U.S. Cl.
CPC ....... *H10K 59/1213* (2023.02); *H01L 27/124* (2013.01); *H01L 27/1255* (2013.01);
(Continued)

(58) Field of Classification Search
CPC ........... H10K 59/1213; H10K 59/1216; H10K 59/1315; H10K 59/1201; H10K 59/131;
(Continued)

(56) References Cited

U.S. PATENT DOCUMENTS

| | | | |
|---|---|---|---|
| 11,335,756 B2 * | 5/2022 | Zhang | ................ H10K 59/1213 |
| 2018/0158417 A1 | 6/2018 | Xiang et al. | |
| 2022/0262309 A1 | 8/2022 | Zhang et al. | |

FOREIGN PATENT DOCUMENTS

| | | |
|---|---|---|
| CN | 107481669 A | 12/2017 |
| CN | 210516730 U | 5/2020 |

(Continued)

OTHER PUBLICATIONS

International Search Report for PCT/CN2021/110760 Mailed Dec. 1, 2021.

*Primary Examiner* — Tan N Tran
(74) *Attorney, Agent, or Firm* — Ling Wu; Stephen Yang; Ling and Yang Intellectual Property

(57) ABSTRACT

A display substrate, including: a base, and a plurality of sub-pixels arranged on the base. At least one of the plurality of sub-pixels includes a pixel driving circuit and a light-emitting element electrically connected to the pixel driving circuit. The pixel driving circuit includes a plurality of transistors and at least one storage capacitor. In a direction perpendicular to the base, the display substrate includes: a semiconductor layer, a first metal layer, a second metal layer, a third metal layer and a fourth metal layer, which are sequentially arranged on the base. The semiconductor layer includes: an active layer of the plurality of transistors. The first metal layer includes at least a scanning line extending in a first direction, a gate electrode of the plurality of transistors, and a first capacitor electrode plate of the storage capacitor.

13 Claims, 21 Drawing Sheets

(51) Int. Cl.
  *H10K 59/121* (2023.01)
  *H10K 59/131* (2023.01)
  *H10K 59/12* (2023.01)

(52) U.S. Cl.
  CPC ..... *H10K 59/1216* (2023.02); *H10K 59/1315* (2023.02); *H10K 59/1201* (2023.02)

(58) Field of Classification Search
  CPC . H01L 27/124; H01L 27/1255; G09G 3/3208; G09G 3/3266
  USPC .................................................. 257/59, 72
  See application file for complete search history.

(56) References Cited

FOREIGN PATENT DOCUMENTS

| | | |
|---|---|---|
| CN | 111489698 A | 8/2020 |
| CN | 112071882 A | 12/2020 |

\* cited by examiner

DISPLAY SUBSTRATE AND METHOD FOR MANUFACTURING SAME, AND DISPLAY APPARATUS

CROSS-REFERENCE TO RELATED APPLICATIONS

The present application is a U.S. National Phase Entry of International Application No. PCT/CN2021/110760 having an international filing date of Aug. 5, 2021, which claims the priority of Chinese patent application No. 202010972329.X, filed to the CNIPA on Sep. 16, 2020 and entitled "Display Substrate and Method for Manufacturing Same, and Display Apparatus". The above-identified applications are hereby incorporated by reference.

TECHNICAL FIELD

The present disclosure relates to, but is not limited to, the field of display technologies, and particularly to a display substrate, a preparation method thereof, and a display apparatus.

BACKGROUND

An Organic Light Emitting Diode (OLED) with advantages of ultra-thin design, large field of view, active emission, high brightness, continuous and adjustable light colors, low cost, quick response, low power consumption, wide working temperature range, flexible display, and the like, has gradually become a next-generation display technology with a broad development prospect and attracted more and more attention. The OLED may be divided into a Passive Matrix (PM) type and an Active Matrix (AM) type according to different drive modes. An AMOLED is a current-driven device and controls each sub-pixel using an independent Thin Film Transistor (TFT), and each sub-pixel may be continuously and independently driven to emit light.

SUMMARY

The following is a summary of subject matters described herein in detail. The summary is not intended to limit the protection scope of claims.

Embodiments of the present disclosure provide a display substrate, a preparation method thereof, and a display apparatus.

In one aspect, an embodiment of the disclosure provides a display substrate, including a substrate and a plurality of sub-pixel units disposed on the substrate. At least one of the plurality of sub-pixels includes a pixel drive circuit and a light emitting element electrically connected to the pixel drive circuit. The pixel drive circuit includes a plurality of transistors and at least one storage capacitor. In a direction perpendicular to the substrate, the display substrate includes a semiconductor layer, a first metal layer, a second metal layer, a third metal layer and a fourth metal layer arranged on the substrate in turn. The semiconductor layer includes active layers of a plurality of transistors. The first metal layer at least includes scan lines extending in a first direction, gate electrodes of the plurality of transistors, and a first capacitor plate of the storage capacitor. The second metal layer at least includes a scan connection line extending along the first direction; an insulating layer between the second metal layer and the first metal layer is provided with a first via, and the scan connection line contacts the scan line exposed through the first via. The third metal layer at least includes a second capacitor plate of the storage capacitor. The fourth metal layer at least includes data lines extending in a second direction perpendicular to the first direction and source electrodes and drain electrodes of the plurality of transistors. The scan line includes a first part and a second part connected in turn along a first direction. A projection of the first part on the substrate overlaps a projection of the fourth metal layer on the substrate, and a projection of the second part on the substrate does not overlap a projection of the fourth metal layer on the substrate. An average length of the second part in the second direction is greater than an average length of the first part in the second direction.

In some exemplary embodiments, the first part has a first edge and a second edge extending in a first direction, the second part has a first edge and a third edge extending in a first direction, the second edge and the third edge are located on a same side of the first edge along the second direction, and the third edge is located on a side of the second edge away from the first edge.

In some exemplary embodiments, the first edge is an upper edge of the first part and the second part, the second edge is a lower edge of the first part, and the third edge is a lower edge of the second part.

In some exemplary embodiments, a projection of the scan connection line on the substrate includes a projection of the scan line on the substrate.

In some exemplary embodiments, the material of the first metal layer is molybdenum, and the second metal layer includes a three-layer stacked structure formed of titanium, aluminum, and titanium.

In some exemplary embodiments, the fourth metal layer further includes a first power supply line extending in a second direction; and six columns of sub-pixels are provided between two adjacent first power supply lines.

In some exemplary embodiments, the first metal layer further includes a power connection line extending in a first direction, wherein the power connection line is connected to the first power supply line and the six columns of sub-pixels.

In some exemplary embodiments, the display substrate further includes a first insulating layer, a second insulating layer, a third insulating layer and a fourth insulating layer. The first insulating layer is arranged between the semiconductor layer and the first metal layer, the second insulating layer is arranged between the first metal layer and the second metal layer, the third insulating layer is arranged between the second metal layer and the third metal layer, and the fourth insulating layer is arranged between the third metal layer and the fourth metal layer.

In some exemplary embodiments, the display substrate further includes a fifth metal layer disposed on a side of the fourth metal layer away from the substrate; the fifth metal layer at least includes a connection electrode for electrically connecting the pixel drive circuit and the light emitting element.

In some exemplary embodiments, the pixel drive circuit includes a first transistor, a second transistor, a third transistor, a fourth transistor, a fifth transistor and a storage capacitor. The gate electrode of the first transistor is connected to the second electrode of the third transistor, the first capacitor electrode plate of the storage capacitor and the second electrode of the fourth transistor, the first electrode of the first transistor is connected to the second electrode of the second transistor, the second electrode of the first transistor is connected to the second capacitor plate of the storage capacitor, the first electrode of the fifth transistor and the first electrode of the light emitting element. The gate electrode of the second transistor is connected to an emitting control line, and the first electrode of the second transistor is connected to a first power supply line. The gate electrode of the third transistor is connected to a first control signal line, and the first electrode of the third transistor is connected to a reference voltage line. The gate electrode of the fourth transistor is connected to a scan line, and the first electrode of the fourth transistor is connected to a data line. The gate electrode of the fifth transistor is connected to a second control signal line, and the second electrode of the fifth transistor is connected to an initial voltage line.

In some exemplary embodiments, the third transistor, the fourth transistor, and the fifth transistor are double gate transistors; each double gate transistor includes two gate electrodes connected to each other.

In some exemplary embodiments, the first capacitor plate of the storage capacitor and the gate electrode of the first transistor are integrally structured.

In some exemplary embodiments, the first metal layer further includes a first control signal line, a second control signal line and an emitting control line; the third metal layer further includes a reference voltage line and an initial voltage line. The first control signal line, the second control signal line, the emitting control line, the reference voltage line and the initial voltage line all extend along the first direction.

In some exemplary embodiments, in the second direction, the first control signal line and the second control signal line are located on both sides of the scan line, and the emitting control line is located on a side of the second control signal line away from the scan line. A projection of the reference voltage line on the substrate is located on a side of a projection of the first control signal line on the substrate away from a projection of the scan line on the substrate, and a projection of the initial voltage line on the substrate is located between a projection of the second control signal line and a projection of the emitting control line on the substrate.

In another aspect, an embodiment of the present disclosure provides a display apparatus, which includes the aforementioned display substrate.

In another aspect, an embodiment of the present disclosure provides a preparation method for a display substrate. The display substrate includes a substrate and a plurality of sub-pixels disposed on the substrate, at least one of the plurality of sub-pixels includes a pixel drive circuit and a light emitting element electrically connected to the pixel drive circuit; the pixel drive circuit includes a plurality of transistors and at least one storage capacitor. The preparation method includes: sequentially forming a semiconductor layer, a first metal layer, a second metal layer, a third metal layer and a fourth metal layer on the substrate. The semiconductor layer includes active layers of a plurality of transistors. The first metal layer at least includes scan lines extending in a first direction, gate electrodes of the plurality of transistors, and a first capacitor plate of the storage capacitor. The second metal layer at least includes a scan connection line extending along the first direction; an insulating layer between the second metal layer and the first metal layer is provided with a first via, and the scan connection line contacts the scan line exposed through the first via. The third metal layer at least includes a second capacitor plate of the storage capacitor. The fourth metal layer at least includes a data line extending in a second direction perpendicular to the first direction and source electrodes and drain electrodes of the plurality of transistors. The scan line includes a first part and a second part connected in sequence along a first direction, a projection of the first part on the substrate overlaps a projection of the fourth metal layer on the substrate, a projection of the second part on the substrate does not overlap a projection of the fourth metal layer on the substrate, and an average length of the second part in the second direction is greater than an average length of the first part in the second direction.

After reading and understanding the drawings and the detailed description, other aspects may be understood.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
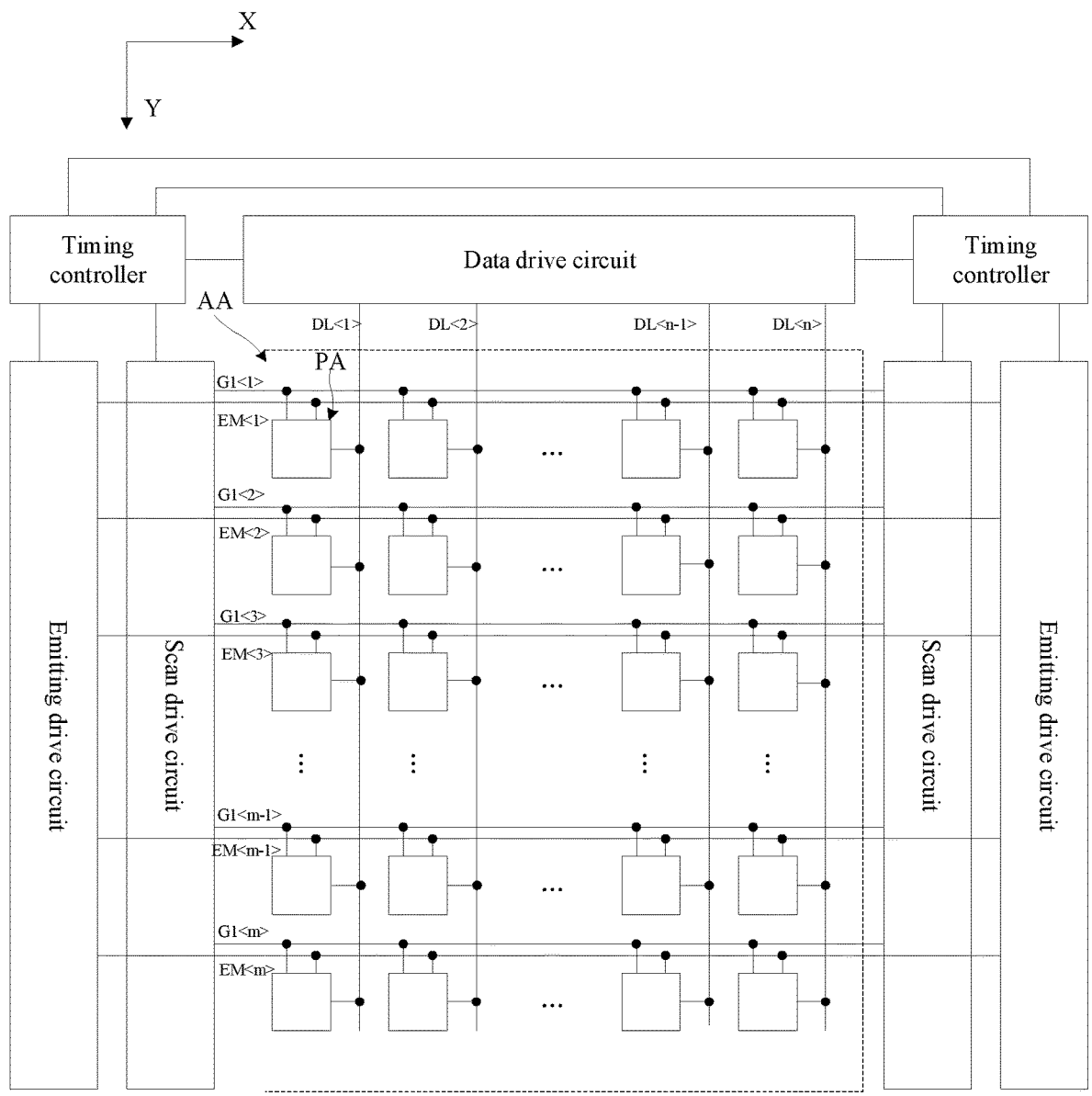
FIG. 1 is a schematic diagram of a structure of a display substrate according to at least one embodiment of the present disclosure.

To make objectives, technical solutions, and advantages of the present disclosure clearer, the embodiments of the present disclosure will be described in detail with reference to the accompanying drawings. Implementation modes may be implemented in a plurality of different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one embodiment of the present disclosure is not necessarily limited to the size, and shapes and sizes of various components in the drawings do not reflect actual scales. In addition, the drawings schematically illustrate ideal examples, and an embodiment of the present disclosure is not limited to the shapes, numerical values, or the like shown in the drawings.

Ordinal numerals such as "first", "second" and "third" in the present disclosure are set to avoid confusion of constituents, but not intended for restriction in quantity. In the present disclosure, "a plurality of" represents two or more than two.

In the present disclosure, sometimes for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings. These terms are not intended to indicate or imply that involved devices or elements must have specific orientations and be structured and operated in the specific orientations but only to facilitate describing the present specification and simplify the description, and thus should not be understood as limitations on the present disclosure. The positional relationships between the constituent elements may be changed as appropriate based on the directions according to which the constituent elements are described. Therefore, appropriate replacements may be made according to situations without being limited to the wordings described in the specification.

In the present disclosure, unless otherwise specified and defined, terms "mounting", "mutual connection" and "connection" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the present disclosure, a transistor refers to an element including at least three terminals, namely, a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the present disclosure, the channel region refers to a region through which the current mainly flows.

In the present disclosure, a first electrode may be a drain electrode while a second electrode may be a source electrode, or a first electrode may be a source electrode while a second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "electric connection" includes a case where constituent elements are connected through an element with a certain electrical action. The "element with the certain electrical effect" is not particularly limited as long as electrical signals may be sent and received between the connected constituent elements. Examples of the "element with the certain electrical action" not only include electrodes and wirings, but also include switching elements such as transistors, resistors, inductors, capacitors, other elements with one or more functions, etc.

In the present disclosure, "parallel" refers to a state in which an angle formed by two straight lines is above-10 degrees and below 10 degrees, and thus may include a state in which the angle is above-5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

At least one embodiment of the present disclosure provides a display substrate, including a substrate and a plurality of sub-pixels disposed on the substrate. At least one of the sub-pixels includes a pixel drive circuit and a light emitting element electrically connected to the pixel drive circuit. The pixel drive circuit includes a plurality of transistors and at least one storage capacitor. In a direction perpendicular to the substrate, the display substrate includes a semiconductor layer, a first metal layer, a second metal layer, a third metal layer and a fourth metal layer arranged on the substrate in turn. The semiconductor layer includes active layers of a plurality of transistors. The first metal layer at least includes scan lines extending in a first direction, gate electrodes of the plurality of transistors, and a first capacitor plate of the storage capacitor. The second metal layer at least includes a scan connection line extending in the first direction. The third metal layer at least includes a second capacitor plate of the storage capacitor. The fourth metal layer at least includes a data line extending in a second direction perpendicular to the first direction, source electrodes and drain electrodes of the plurality of transistors. An insulating layer between the second metal layer and the first metal layer is provided with a first via, and the scan connection line contacts the scan line exposed through the first via. The scan line includes a first part and a second part connected in sequence along a first direction, a projection of the first part on the substrate overlaps a projection of the fourth metal layer on the substrate, a projection of the second part on the substrate does not overlap a projection of the fourth metal layer on the substrate, and an average length of the second part in the second direction is greater than an average length of the first part in the second direction.

In the present disclosure, "width" denotes a feature dimension extending in a first direction and "length" denotes a feature dimension extending in a second direction.

According to the display substrate provided by the embodiment, by designing the overlapping region of the projections of the scan line and the fourth metal layer on the substrate to be narrow, spatial optimization is achieved. Moreover, by arranging a scan connection line connected to the scan line in the second metal layer, the resistance of the scan line may be greatly reduced on the basis of ensuring that the parasitic capacitance of the scan line is not increased, thereby reducing the loading of the scan line, so as to meet the driving demand and ensure the normal driving function.

In some exemplary embodiments, the first part has a first edge and a second edge extending in a first direction, the second part has a first edge and a third edge extending in a first direction, the second edge and the third edge are located on a same side of the first edge along the second direction, and the third edge is located on a side of the second edge away from the first edge. In some examples, the scan line extends in a first direction and has a straight first edge and a second edge provided with a first protrusion; the first protrusion is disposed on the second edge and extends in a direction away from the second edge, and the first protrusion has a third edge relative to the second edge. The region between the first protrusion, the second edge corresponding to the position of the first protrusion and the first edge form a second part, and the region except the second part is the first part. The first protrusion may have a flat third edge, and the third edge may be parallel to the second edge. However, this embodiment is not limited thereto. For example, the third edge may have a wavy structure.

In some exemplary embodiments, the first edge is an upper edge of the first part and second part of the scan line, the second edge is a lower edge of the first part of the scan line, and the third edge is a lower edge of the second part of the scan line. However, this embodiment is not limited thereto. For example, the first edge may be a lower edge of the first part and second part of the scan line, the second edge may be an upper edge of the first part of the scan line, and the third edge may be an upper edge of the second part of the scan line.

In some exemplary embodiments, a projection of the scan connection line on the substrate includes a projection of the scan line on the substrate. In some examples, the scan connection line may have a flat fourth edge and a flat fifth edge. The fourth edge and the fifth edge extend in a first direction and are oppositely arranged. The distance between the fourth edge and the fifth edge (i.e. the length of the scan connection line in the second direction) may be greater than or equal to the maximum distance between the first edge and the third edge of the scan line (i.e. the maximum length of the second part of the scan line in the second direction). However, this embodiment is not limited thereto. For example, a projection of the scan connection line on the substrate may overlap a projection of the scan line on the substrate, i.e. the shape of the scan connection line and the scan line may be the same. As another example, a projection of the scan connection line on the substrate may partially overlap a projection of the scan line on the substrate. For example, the scan connection line may have a fourth edge and a fifth edge that are flat and extend along a first direction, the fourth edge and the fifth edge are disposed opposite to each other, and the distance between the fourth edge and the fifth edge is less than or equal to the distance between the first edge and the second edge of the scan line.

In some exemplary embodiments, the material of the first metal layer is molybdenum (Mo), and the second metal layer includes a three-layer stacked structure of titanium (Ti), aluminum (Al), and titanium. That is, the second metal layer may include a titanium layer, an aluminum layer, and a titanium layer stacked in sequence. However, the present embodiment does not limit the materials of the first metal layer and the second metal layer. In some examples, the second metal layer may be a single-layer metal structure. In the present exemplary embodiment, the second metal layer is formed by using a metal material having a low resistivity, and the resistance of the scan connection line may be reduced.

In some exemplary embodiments, the fourth metal layer further includes a first power supply line extending in a second direction. Six columns of sub-pixels are arranged between two adjacent first power supply lines. In the exemplary embodiment, the first power supply line is designed as a "one drives six" structure, and the size of each sub-pixel may be effectively increased under the same PPI (Pixels Per Inch), which has the advantages of fully utilizing layout space, reasonable overall layout and the like.

In some exemplary embodiments, the first metal layer further includes a power connection line extending in a first direction, wherein the power connection line is connected to the first power supply line and the six columns of sub-pixels. Wherein, the extending direction of the power connection line is perpendicular to the extending direction of the first power supply line.

In some exemplary embodiments, the display substrate may further include a first insulating layer, a second insulating layer, a third insulating layer and a fourth insulating layer. The first insulating layer is arranged between the semiconductor layer and the first metal layer, the second insulating layer is arranged between the first metal layer and the second metal layer, the third insulating layer is arranged between the second metal layer and the third metal layer, and the fourth insulating layer is arranged between the third metal layer and the fourth metal layer. In some examples, a first insulating layer, a second insulating layer, a third insulating layer, and a fourth insulating layer may be inorganic insulating layers.

In some exemplary embodiments, the display substrate further includes a fifth metal layer disposed on a side of the fourth metal layer away from the substrate; the fifth metal layer at least includes a connection electrode for electrically connecting the pixel drive circuit and the light emitting element. In some examples, the first metal layer may be referred to as the first gate metal layer, the second metal layer may be referred to as the second gate metal layer, the third metal layer may be referred to as the third gate metal layer, the fourth metal layer may be referred to as the first source-drain metal layer, and the fifth metal layer may be referred to as the second source-drain metal layer.

In some exemplary embodiments, the pixel drive circuit includes a first transistor, a second transistor, a third transistor, a fourth transistor, a fifth transistor and a storage capacitor. The gate electrode of the first transistor is connected to the second electrode of the third transistor, the first capacitor electrode plate of the storage capacitor and the second electrode of the fourth transistor, the first electrode of the first transistor is connected to the second electrode of the second transistor, the second electrode of the first transistor is connected to the second capacitor plate of the storage capacitor, the first electrode of the fifth transistor and the first electrode of the light emitting element; The gate electrode of the second transistor is connected to an emitting control line, and the first electrode of the second transistor is connected to a first power supply line; the gate electrode of the third transistor is connected to a first control signal line, and the first electrode of the third transistor is connected to a reference voltage line; the gate electrode of the fourth transistor is connected to a scan line, and the first electrode of the fourth transistor is connected to a data line; and the gate electrode of the fifth transistor is connected to a second control signal line, and the second electrode of the fifth transistor is connected to an initial voltage line. Wherein, the first transistor is a drive transistor. In the present exemplary embodiment, the pixel drive circuit may adopt a 5T1C design. However, this embodiment is not limited thereto.

In some exemplary embodiments, the third transistor, the fourth transistor, and the fifth transistor are double gate transistors; each double gate transistor includes two gate electrodes connected to each other. In the present exemplary embodiment, the leakage currents of the third transistor, the fourth transistor, and the fifth transistor may be reduced by adopting a double gate design, thereby ensuring the function of the pixel drive circuit to be formal.

In some exemplary embodiments, the first capacitor plate of the storage capacitor and the gate electrode of the first transistor are integrally structured. A projection of the first capacitor plate of the storage capacitor on the substrate overlaps a projection of the active layer of the first transistor on the substrate. In the present exemplary embodiment, the first capacitor electrode plate of the storage capacitor and the gate electrode of the first transistor are designed into an integrated structure, so that the layout space is fully utilized, and the overall layout is reasonable.

In some exemplary embodiments, the first metal layer further includes a first control signal line, a second control signal line, and an emitting control line; the third metal layer further includes a reference voltage line and an initial voltage line. The first control signal line, the second control signal line, the emitting control line, the reference voltage line and the initial voltage line all extend along the first direction.

In some exemplary embodiments, in the second direction, the first control signal line and the second control signal line are located on both sides of the scan line, and the emitting control line is located on a side of the second control signal line away from the scan line. A projection of the reference voltage line on the substrate is located on a side of a projection of the first control signal line on the substrate away from a projection of the scan line on the substrate, and a projection of the initial voltage line on the substrate is located between a projection of the second control signal line and a projection of the emitting control line on the substrate. However, this embodiment is not limited thereto.

FIG. 1 is a schematic diagram of a structure of a display substrate according to at least one embodiment of the present disclosure. As shown in FIG. 1, the display substrate of the present exemplary embodiment may include a display region (Active Area, AA) and a peripheral region on a periphery of the display region AA. The display region AA may be provided with a plurality of sub-pixels PA arranged regularly, a plurality of first signal lines (including, for example, a scan line G1, a control signal line, and an emitting control line EM) extending in a first direction (such as the X direction in FIG. 1), and a plurality of second signal lines (including, for example, a data line DL and a first power supply line) extending in a second direction (such as the Y direction in FIG. 1). The first direction and the second direction may be in a same plane, and the first direction may be perpendicular to the second direction. For example, the first direction may refer to a row direction parallel to an extension direction of a scan line; and the second direction may refer to a column direction parallel to an extension direction of a data line. In the present exemplary embodiment, at least one first signal line may extend in the X direction and a plurality of first signal lines may be sequentially arranged in the Y direction. At least one second signal line may extend in the Y direction, and a plurality of second signal lines may be sequentially arranged in the X direction. At least one sub-pixel among the plurality of sub-pixels PA may include: a light emitting element and a pixel drive circuit that drives the light emitting element to emit light. The pixel drive circuit may include a plurality of transistors and at least one storage capacitor, such as a 3T1C, 5T1C, or 7T1C design. However, this embodiment is not limited thereto.

In some exemplary embodiments, as shown in FIG. 1, m rows of scan lines G1<1> to G1<m> are arranged along the Y direction, and n columns of data lines DL<1> to DL<n> are arranged along the X direction, the scan line and the data line are insulated from each other, where m and n are integers greater than 0. The sub-pixels PA may be distributed at intersecting positions of m-row scan lines and n-column data lines, and a plurality of sub-pixels PA are arranged according to a matrix-like rule. In some examples, three sub-pixels emitting different color light (e.g. red green blue) or four sub-pixels emitting different color light (e.g. red green blue white) may form a pixel unit. However, this embodiment is not limited thereto.

In order to facilitate the distinction between the scan lines and the sub-pixel lines, in FIG. 1 they are sometimes referred to as the first line, the second line . . . , and the m-th line in order from the top. Similarly, in order to facilitate the distinction between the data lines and the sub-pixel columns, in FIG. 1 they are sometimes referred to as column 1, column 2 . . . , and column n in order from the left.

In some exemplary embodiments, as shown in FIG. 1, the peripheral region may be provided with a timing controller, a data drive circuit, a scan drive circuit and an emitting drive circuit. The scan drive circuit and the emitting drive circuit may be arranged on opposite sides of the display region AA (for example, the left side and right side of the display region AA), and the timing controller and the data drive circuit may be arranged on a side of the display region (for example, upper side or lower side of the display region AA). However, this embodiment is not limited thereto. The data drive circuit may supply data signals to a plurality of columns of sub-pixels through a plurality of data lines DL. The scan drive circuit may supply scan signals to a plurality of rows of sub-pixels through a plurality of scan lines G1. In addition to the scan signal, the scan drive circuit may generate at least one control signal (not shown in FIG. 1) synchronized with the scan signal on a row basis and supply it to a plurality of rows of sub-pixels of the display region. The light emitting drive circuit may provide emitting control signals to a plurality of rows of sub-pixels through a plurality of emitting control lines EM. The timing controller may provide drive signals to the data drive circuit, the scan drive circuit and the emitting drive circuit. Actions of the scan drive circuit, the data drive circuit and the emitting control circuit may be controlled by the timing controller. The timing controller may provide gray scale data specifying a gray scale that should be displayed at a sub-pixel to the data drive circuit. The data drive circuit may provide a data signal of a potential corresponding to the gray scale data of the sub-pixel to sub-pixels of a row selected by the scan drive circuit via a data line.

Figure 2:
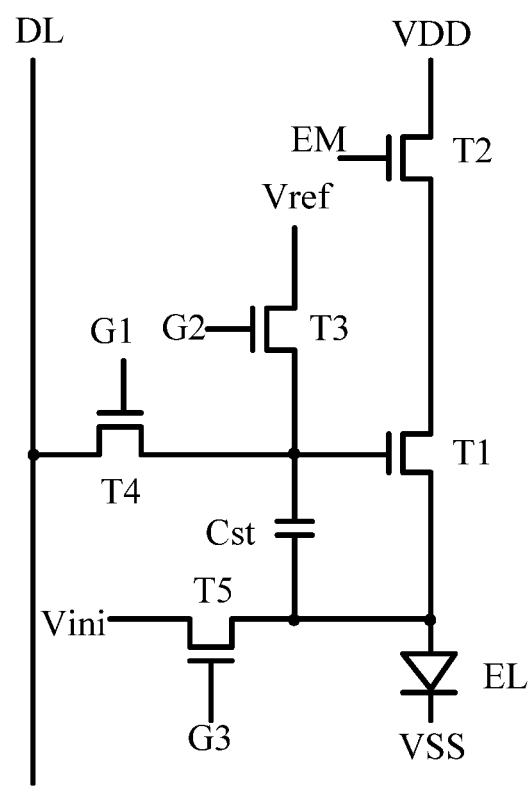
FIG. 2 is an equivalent circuit diagram of a pixel drive circuit according to at least one embodiment of the present disclosure.

FIG. 2 is a schematic equivalent circuit diagram of a pixel drive circuit according to at least one embodiment of the present disclosure. FIG. 2 illustrates the structure of a 5T1C pixel drive circuit. As shown in FIG. 2, a pixel drive circuit of a sub-pixel is electrically connected to a scan line G1, a first control signal line G2, a second control signal line G3, an emitting control line EM, a first power supply line VDD, a reference voltage line Vref, an initial voltage line Vini, and a data line DL. The pixel drive circuit includes a first transistor T1, a second transistor T2, a third transistor T3, a fourth transistor T4, a fifth transistor T5 and a storage capacitor Cst.

In some exemplary embodiments, the gate electrode of the first transistor T1 is connected to the second electrode of the third transistor T3, the first capacitor electrode plate of the storage capacitor Cst and the second electrode of the fourth transistor T4, the first electrode of the first transistor T1 is connected to the second electrode of the second transistor T2, the second electrode of the first transistor T1 is connected to the second capacitor plate of the storage capacitor Cst, the first electrode of the fifth transistor T5 and the first electrode of the light emitting element EL. The gate electrode of the second transistor T2 is connected to an emitting control line, and the first electrode of the second transistor T2 is connected to a first power supply line VDD. The gate electrode of the third transistor T3 is connected to a first control signal line G2, and the first electrode of the third transistor T3 is connected to a reference voltage line Vref. The gate electrode of the fourth transistor T4 is connected to a scan line G1, and the first electrode of the fourth transistor T4 is connected to a data line DL. The gate electrode of the fifth transistor T5 is connected to a second control signal line G3, and the second electrode of the fifth transistor T5 is connected to an initial voltage line Vini. A second electrode of the light emitting element EL is connected to a second power supply line VSS. The light emitting element EL is configured to emit light of a corresponding brightness in response to the current of the second electrode of the first transistor T1. The fifth transistor T5 can extract the threshold voltage Vth and the mobility of the first transistor T1 in response to the timing of compensation to compensate for the threshold voltage Vth. The storage capacitor Cst is configured to hold node voltages of the gate electrode and the second electrode of the first transistor T1 during one frame of light emitting period. The first transistor T1 is a drive transistor, and all other transistors except the first transistor T1 are switch transistors. The first transistors T1 to the fifth transistors T5 provided in the present exemplary embodiment may all be P-type transistors or N-type transistors. This embodiment is not limited thereto.

In some exemplary embodiments, the first transistor T1 to the fifth transistor T5 are all low temperature polysilicon thin film transistors, oxide semiconductor thin film transistors, or amorphous silicon thin film transistors. The transistors in the pixel drive circuit provided by the embodiment are all of the same type of transistors, which may avoid the influence of the difference between the transistors of different types on the pixel drive circuit.

Figure 3:
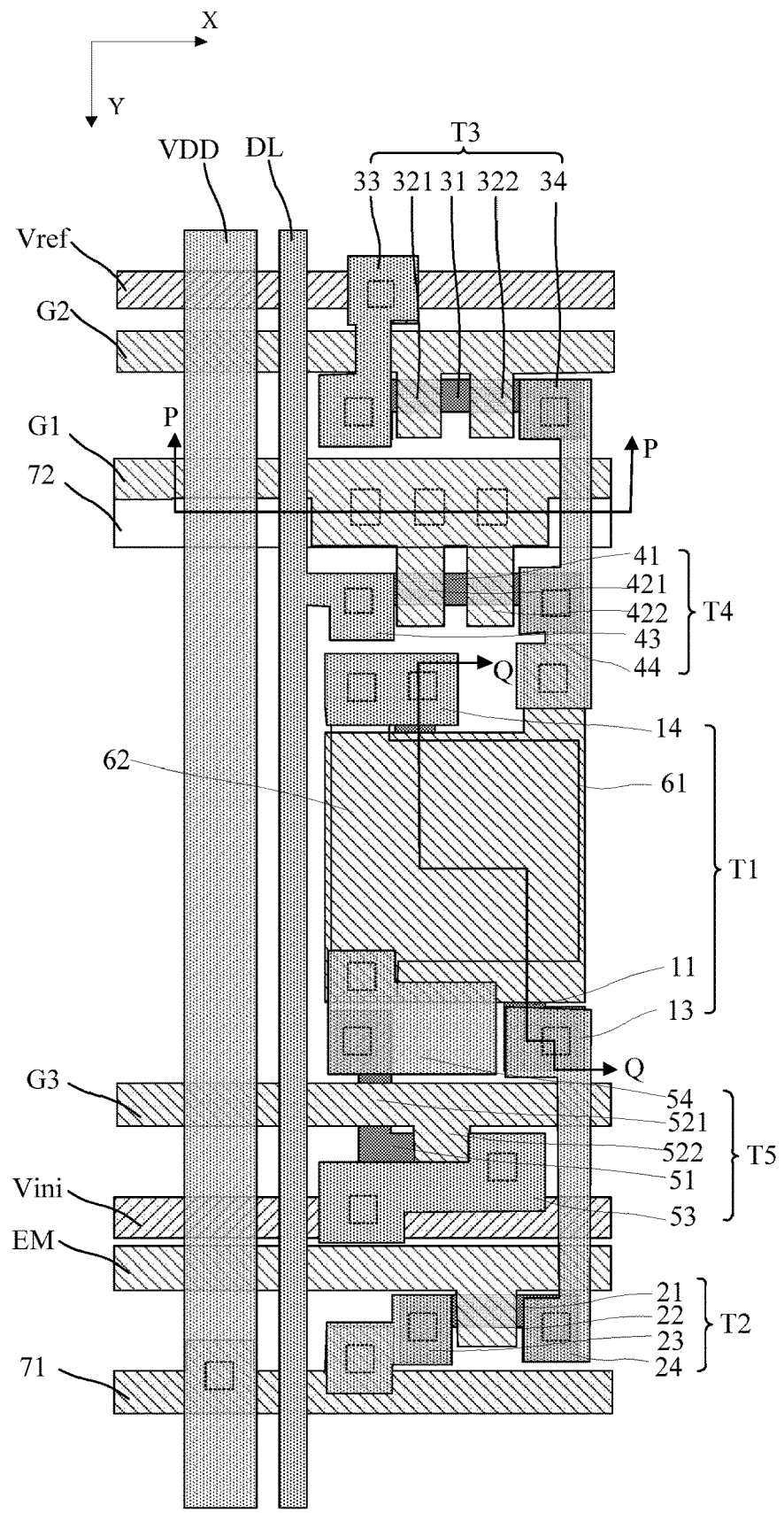
FIG. 3 is a top view of a sub-pixel of a display substrate according to at least one embodiment of the present disclosure.
Figure 4:
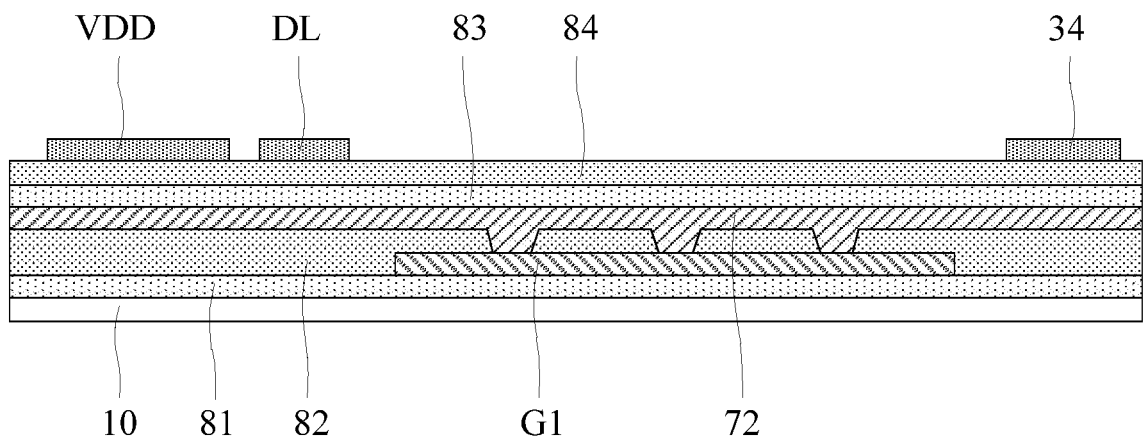
FIG. 4 is a schematic sectional view along P-P direction in FIG. 3.
Figure 5:
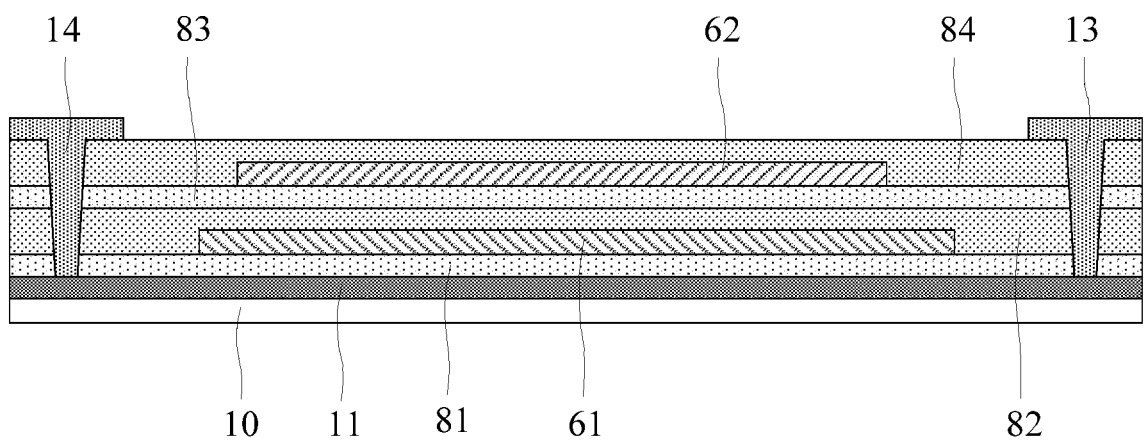
FIG. 5 is a schematic sectional view along Q-Q direction in FIG. 3.

FIG. 3 is a top view of a sub-pixel of a display substrate according to at least one embodiment of the present disclosure. FIG. 4 is a schematic sectional view along P-P direction in FIG. 3. FIG. 5 is a schematic sectional view along a Q-Q direction in FIG. 3. As shown in FIGS. 3 to 5, the display region of the display substrate provided by the present exemplary embodiment includes a substrate 10, a semiconductor layer, a first metal layer, a second metal layer, a third metal layer, and a fourth metal layer arranged on the substrate 10 in sequence. The first insulating layer 81 is arranged between the semiconductor layer and the first metal layer, the second insulating layer 82 is arranged between the first metal layer and the second metal layer, the third insulating layer 83 is arranged between the second metal layer and the third metal layer, and the fourth insulating layer 84 is arranged between the third metal layer and the fourth metal layer. In some examples, the side of the fourth metal layer away from the substrate is further provided with a fifth metal layer. A fifth insulating layer is disposed between the fourth metal layer and the fifth metal layer. A sixth insulating layer and a light emitting element are sequentially arranged on the side of the fifth metal layer far away from the substrate. The light emitting element may include a first electrode, an organic emitting layer, and a second electrode stacked on the sixth insulating layer. The first electrode may be a transparent anode and the second electrode may be a reflective cathode, or the first electrode may be a reflective anode and the second electrode may be a transparent cathode. The first electrode of the light emitting element may be connected to the fifth metal layer through a via on the sixth insulating layer.

In some exemplary embodiments as shown in FIG. 3, the semiconductor layer may have a curved or bent shape. The semiconductor layer may include a first active layer 11, a second active layer 21, a third active layer 31, a fourth active layer 41, and a fifth active layer 51. The first metal layer may include a scan line G1, a first control signal line G2, a second control signal line G3, an emitting control line EM, a power connection line 71, a first capacitor plate 61, a second gate electrode 22, a third gate electrode 321, a fourth gate electrode 322, a fifth gate electrode 421, a sixth gate electrode 422, a seventh gate electrode 521, and an eighth gate electrode 522. The scan line G1, the first control signal line G2, the second control signal line G3, the emitting control line EM, and the power connection line 71 all extend in the X direction. The second metal layer may include a scan connection line 72 extending in the X direction. The third metal layer may include a reference voltage line Vref, an initial voltage line Vini, and a second capacitor plate 62. Both the reference voltage line Vref and the initial voltage line Vini extend in the X direction. The fourth metal layer may include a first power supply line VDD, a data line DL, a first source electrode 13, a first drain electrode 14, a second source electrode 23, a second drain electrode 24, a third source electrode 33, a third drain electrode 34, a fourth source electrode 43, a fourth drain electrode 44, a fifth source electrode 53, and a fifth drain electrode 54. The first power supply line VDD and the data line DL extend in the Y direction. The first capacitor plate 61 may serve as the gate electrode of the first transistor T1. The first active layer 11, the first capacitor plate 61, the first source electrode 13, and the first drain electrode 14 form a first transistor T1; the second active layer 21, the second gate electrode 22, the second source electrode 23 and the second drain electrode 24 form a second transistor T2. The third active layer 31, the third gate electrode 321, the fourth gate electrode 322, the third source electrode 33 and the third drain electrode 34 form a third transistor T3. The fourth active layer 41, the fifth gate electrode 421, the sixth gate electrode 422, the fourth source electrode 43, and the fourth drain electrode 44 form a fourth transistor T4. The fifth active layer 51, the seventh gate electrode 521, the eighth gate electrode 522, the fifth source electrode 53, and the fifth drain electrode 54 form a fifth transistor T5. The third transistor T3, the fourth transistor T4, and the fifth transistor T5 are double gate transistors. In the present exemplary embodiment, the third transistor T3, the fourth transistor T4, and the fifth transistor T5 adopt a double gate design, which may reduce the drain electrode of the transistor and ensure the function of the pixel drive circuit to be normal.

In some exemplary embodiments as shown in FIGS. 3 and 4, the scan connection line 72 may be connected to the scan line G1 through a plurality of vias (e.g. three vias). A projection of the scan connection line 72 on the substrate 10 includes a projection of the scan line G1 on the substrate 10. By connecting the scan connection line 72 to the scan line G1 through at least one via, the resistance may be greatly reduced without increasing the parasitic capacitance on the scan line G1, thereby reducing the load on the scan line G1 and ensuring the normal function of the pixel drive circuit. This embodiment does not limit the shape and size of the scan connection line 72.

In some exemplary embodiments, as shown in FIG. 3, a projection of the scan line G1 on the substrate 10 overlaps with the projections of the first power supply line VDD, the data line DL of the fourth metal layer and the third drain electrode 34 of the third transistor T3 on the substrate 10. The scan line G1 includes a first part and a second part connected in sequence along X direction, a projection of the first part on the substrate 10 overlaps a projection of the fourth metal layer on the substrate 10, and a projection of the second part on the substrate 10 does not overlap a projection of the fourth metal layer on the substrate. The average length of the second part along the Y direction is larger than the average length of the first part along the Y direction. In the present exemplary embodiment, by narrowing the design of the scan line G1, the layout space may be optimized and the parasitic capacitance of the scan line may be reduced.

The structure of the display substrate will be described below through an example of a manufacturing process of the display substrate. The "patterning process" mentioned in the present disclosure includes processes, such as film layer deposition, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a thin film layer prepared from a material on a substrate by a process of deposition or coating. If a patterning process is not needed for the "thin film" during the whole preparation process, the "thin film" may also be referred to as a "layer". When a patterning process is needed for the "thin film" during the whole preparation process, the thin film is referred to as a "thin film" before the patterning process and referred to as a "layer" after the patterning process. The "layer" after the patterning process at least includes one "pattern".

"A and B are arranged in the same layer" mentioned in the present disclosure refers to that A and B are simultaneously formed by the same patterning process. The "thickness" of the film layer is a size of the film layer in a direction perpendicular to the display substrate. In the exemplary embodiment of the present disclosure, "a projection of A includes a projection of B" refers to that a boundary of a projection of B falls within a range of a boundary of a projection of A or the boundary of a projection of A is overlapped with the boundary of a projection of B.

In some exemplary implementations, a preparation process for the display substrate may include the following operations, as shown in FIG. 6 to FIG. 21. In this exemplary embodiment, a sub-pixel is described as an example and an equivalent circuit diagram of a pixel drive circuit of the sub-pixel is shown in FIG. 2. The transistor in the pixel drive circuit may be an N-type transistor.

(1) A Semiconductor Layer Pattern is Formed.

Figure 6:
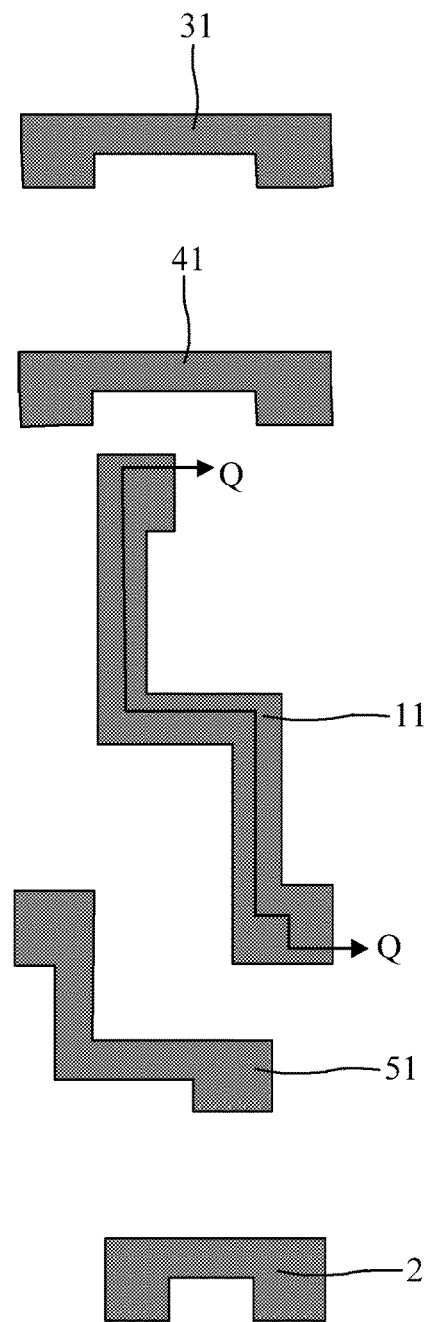
FIG. 6 is a schematic diagram of a sub-pixel after a semiconductor layer pattern is formed according to at least one embodiment of the present disclosure.
Figure 7:
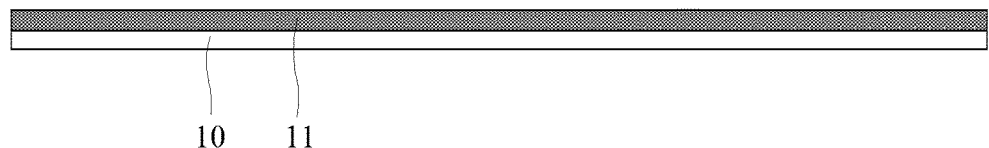
FIG. 7 is a schematic sectional view along Q-Q direction in FIG. 6.

In some exemplary embodiments, a semiconductor thin film is deposited on the substrate 10, and the semiconductor thin film is patterned through a patterning process to form a semiconductor layer pattern. As shown in FIGS. 6 to 7, the semiconductor layer may be curved or bent. The semiconductor layer pattern includes a first active layer 11, a second active layer 21, a third active layer 31, a fourth active layer 41, and a fifth active layer 51. The first active layer 11 serves as an active layer of the first transistor T1, the second active layer 21 serves as an active layer of the second transistor T2, the third active layer 31 serves as an active layer of the third transistor T3, the fourth active layer 41 serves as an active layer of the fourth transistor T4, and the fifth active layer 51 serves as an active layer of the fifth transistor T5. In some examples, the active layer may include a channel region, a source region, and a drain region. The channel region may not be doped with an impurity, and has characteristics of a semiconductor. The source region and the drain region may be on two sides of the channel region and doped with impurities, and thus are conductive. An impurity may be changed according to a type (e.g., an N type or a P type) of a transistor.

In some exemplary implementations, a substrate 10 may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber. However, this embodiment is not limited thereto.

In some embodiments, a manufacturing material of the semiconductor layer may be polysilicon or metal oxides, which is not limited in the embodiments of the present disclosure.

(2) Pattern of a First Metal Layer is Formed.

Figure 8:
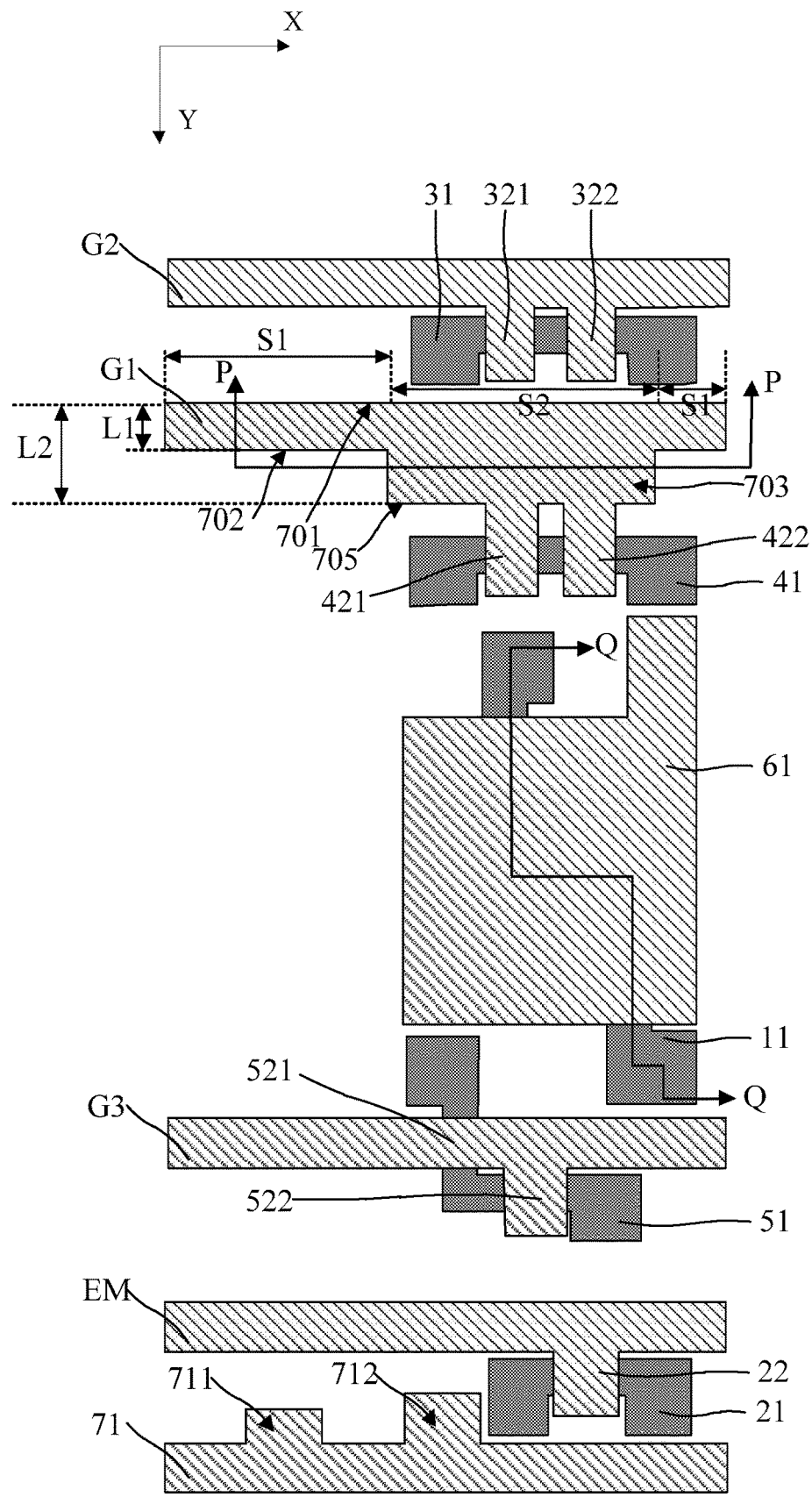
FIG. 8 is a schematic diagram of a sub-pixel after a first metal layer pattern is formed according to at least one embodiment of the present disclosure.
Figure 9:
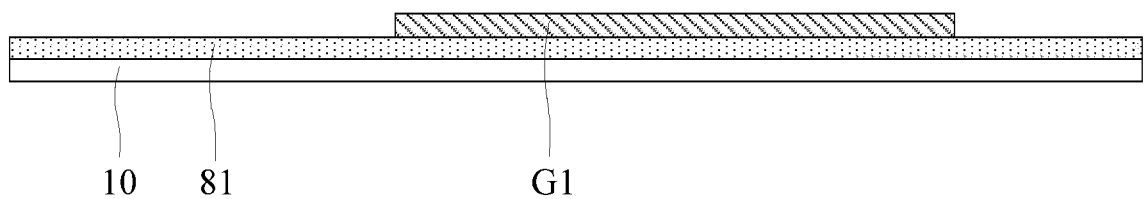
FIG. 9 is a schematic sectional view along P-P direction in FIG. 8.
Figure 10:
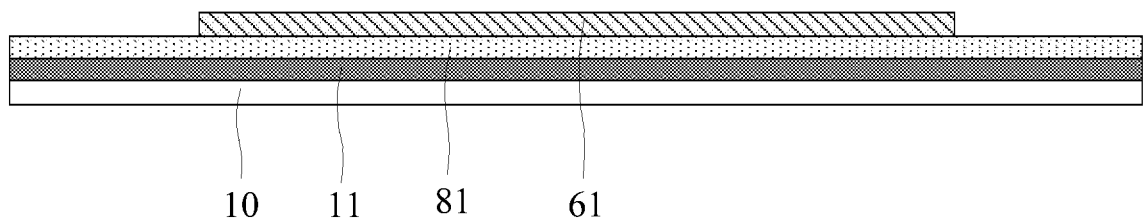
FIG. 10 is a schematic sectional view along Q-Q direction in FIG. 8.

In some exemplary embodiments, a first insulating film and a first metal film are sequentially deposited on the substrate 10 on which the aforementioned patterns are formed, and the first metal film is patterned through a patterning process to form a first insulating layer 81 covering the semiconductor layer pattern and a pattern of the first metal layer formed on the first insulating layer 81. As shown in FIGS. 8 to 10, the pattern of the first metal layer includes a scan line G1, a first control signal line G2, a second control signal line G3, an emitting control line EM, a first capacitor plate 61, a power connection line 71, a second gate electrode 22, a third gate electrode 321, a fourth gate electrode 322, a fifth gate electrode 421, a sixth gate electrode 422, a seventh gate electrode 521, and an eighth gate electrode 522. The projection of the first capacitor plate 61 on the substrate 10 overlaps with the projection of the first active layer 11 on the substrate 10. The first capacitor plate 61 serves both as a plate of the storage capacitor Cst and as a gate electrode of the first transistor T1. In other words, one electrode plate of the storage capacitor Cst and the gate electrode of the first transistor T1 are integrally constructed.

In some exemplary embodiments, as shown in FIG. 8, The scan line G1, the first control signal line G2, the second control signal line G3, the emitting control line EM, and the power connection line 71 all extend in the X direction. The first control signal line G2, the scan line G1, the second control signal line G3, the emitting control line EM, and the power connection line 71 are arranged in order in the Y direction. The first control signal line G2 and the third control signal line G3 are located on both sides of the scan line G1 respectively, the emitting control line EM is located on the side of the third control signal line G3 away from the scan line G1, and the power connection line 71 is located on the side of the emitting control line EM away from the scan line G1.

In some exemplary embodiments, as shown in FIG. 8, the scan line G1 includes a straight first edge 701 and a second edge 702 provided with a first protrusion 703. The first edge 701 is an upper edge of the scan line G1, and the second edge 702 is a lower edge of the scan line G1. The first edge 701 and the second edge 702 each extends in the X direction. The first protrusion 703 is disposed on the second edge 702 and extends in a direction away from the second edge 702. The shape of the first protrusion 703 may be rectangular. However, this embodiment is not limited thereto. The first protrusion 703 includes a flat third edge 705 located on a side of the second edge 702 away from the first edge 701. The third edge 705 may extend in the X direction. The first distance L1 between the second edge 702 and the first edge 701 is smaller than the second distance L2 between the third edge 705 and the first edge 701. In the present exemplary embodiment, the scan line G1 includes a first part S1 and a second part S2 connected in turn in the X direction, wherein the first part S1 and the second part S2 are continuous regions. A first protrusion 703 is formed in the second part S2. The second part S2 is a region between the first edge 701 and the third edge 705 and the first part S1 is an region other than the second part S2. The average length of the first part S1 in the Y direction is smaller than the average length of the second part S2 in the Y direction.

In some exemplary embodiments, as shown in FIG. 8, a fifth gate electrode 421 and a sixth gate electrode 422 are disposed on the third edge 705. The fifth gate electrode 421 and the sixth gate electrode 422 may be disposed at the third edge 705 in the X direction and extend in a direction away from the third edge 705. The fifth gate electrode 421 and the sixth gate electrode 422 may be identical in shape and size. For example both may be rectangular or square. Alternatively, the shapes and sizes of the two may be different, for example, the fifth gate electrode 421 may be rectangular and the sixth gate electrode 422 may be square. Projections of the fifth gate electrode 421 and the sixth gate electrode 422 on the substrate 10 overlap with the fourth active layer 41. In this example, the fifth gate electrode 421, the sixth gate electrode 422, and the scan line G1 may be an integral structure.

In some exemplary embodiments, the first control signal line G2, the third gate electrode 321, and the fourth gate electrode 322 may be an integral structure. As shown in FIG. 8, the first control signal line G2 includes a flat upper edge and a flat lower edge. The third gate electrode 321 and the fourth gate electrode 322 are provided on the lower edge of the first control signal line G2 and extend in a direction away from the lower edge. The third gate electrode 321 and the fourth gate electrode 322 are provided at the lower edge of the first control signal line G2 along the X direction. The third gate electrode 321 and the fourth gate electrode 322 may be identical in shape and size, for example, both are rectangular or square, or may be different in shape and size. Projections of the third gate electrode 321 and the fourth gate electrode 322 on the substrate 10 overlap with a projection of the third active layer 31 on the substrate 10.

In some exemplary embodiments, the second control signal line G3, the seventh gate electrode 521 and the eighth gate electrode 522 are an integral structure. As shown in FIG. 8, the second control signal line G3 includes a flat upper edge and a flat lower edge. A projection of the second control signal line G3 overlaps a projection of the fifth active layer 51 on the substrate 10. An overlapping region of the second control signal line G3 and the fifth active layer 51 may serve as a seventh gate electrode 521. The eighth gate electrode 522 is provided at the lower edge of the second control signal line G3 and extends in a direction away from the lower edge. The eighth gate electrode 522 may be rectangular or square. A projection of the eighth gate electrode 522 on the substrate 10 overlaps with a projection of the fifth active layer 51 on the substrate 10. However, this embodiment is not limited thereto. In some examples, the second control signal line may include an upper edge provided with a protrusion and a flat lower edge, an overlapping region of the second control signal line and the fifth active layer may serve as a seventh gate electrode, and an eighth gate electrode may be provided on the lower edge of the second control signal line and extend in a direction away from the lower edge.

In some exemplary embodiments, the emitting control line EM and the second gate electrode 22 may be an integral structure. As shown in FIG. 8, the emitting control line EM includes a flat upper edge and a flat lower edge. Both the upper edge and the lower edge of the emitting control line EM extend along the X direction. The second gate electrode 22 is provided on the lower edge of the emitting control line EM and extends in a direction away from the lower edge. The second gate electrode 22 may be rectangular or square. A projection of the second gate electrode 22 on the substrate 10 overlaps with a projection of the second active layer 21 on the substrate 10.

In some exemplary embodiments, the power connection line 71 may include an upper edge provided with a first protrusion 711 and a second protrusion 712, and a flat lower edge. The first protrusion 711 and the second protrusion 712 are provided on the upper edge of the power connection line 71 and extend in a direction away from the upper edge. The first protrusion 711 and the second protrusion 712 are sequentially arranged on the upper edge of the power connection line 71 in the X direction. The shapes and sizes of the first protrusion 711 and second protrusion 712 may be the same or different, for example, the first protrusion 711 and second protrusion 712 are both rectangular, and the size of the first protrusion 711 is smaller than that of the second protrusion 712. However, this embodiment is not limited thereto. In some examples, the power connection line 71 may include a flat upper edge and a flat lower edge.

(3) A Pattern of a Second Insulating Layer is Formed.

Figure 11:
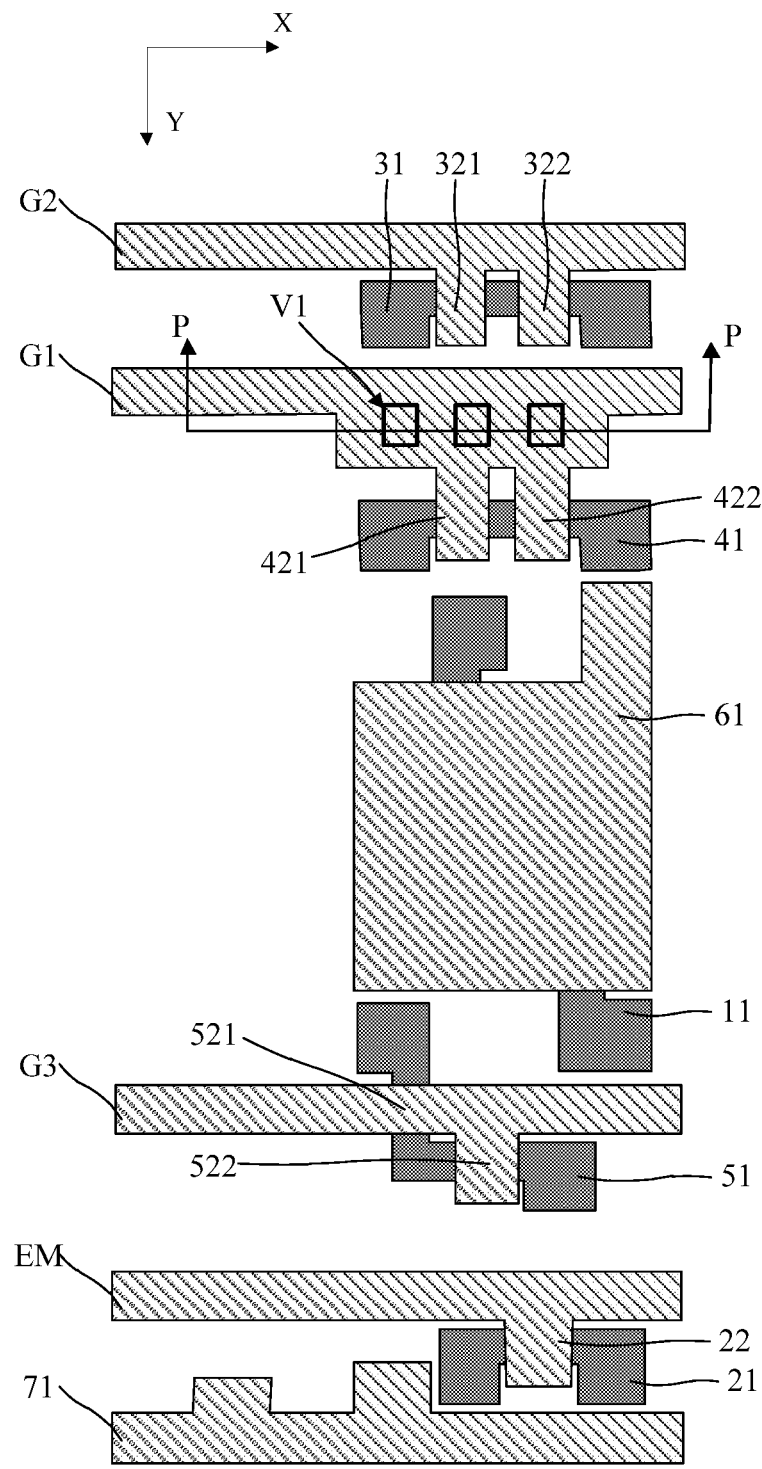
FIG. 11 is a schematic diagram of a sub-pixel after a second insulating layer pattern is formed according to at least one embodiment of the present disclosure.
Figure 12:
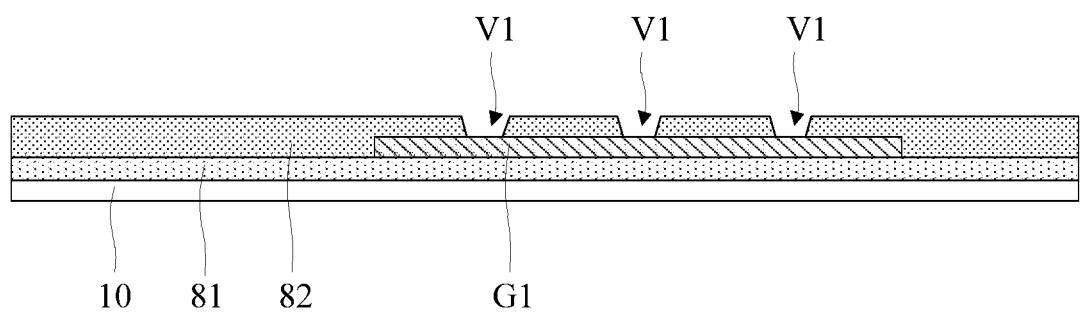
FIG. 12 is a schematic sectional view along P-P direction in FIG. 11.

In some exemplary embodiments, a second insulating thin film is deposited on the substrate 10 on which the aforementioned patterns are formed, and the second insulating thin film is patterned through a patterning process to form a pattern of a second insulating layer covering the aforementioned structures. As shown in FIGS. 11 and 12, the second insulating layer 82 is provided with a plurality of via patterns, and the plurality of via patterns include at least three first via V1 located at the position where the scan line G1 is located. Three first vias V1 are provided at intervals in the X direction, and the second insulating layer 82 in each of the first vias V1 is etched away, exposing the surface of the scan line G1. The first via V1 may be rectangular or circular. This embodiment is not limited thereto.

(4) A Pattern of a Second Metal Layer is Formed.

Figure 13:
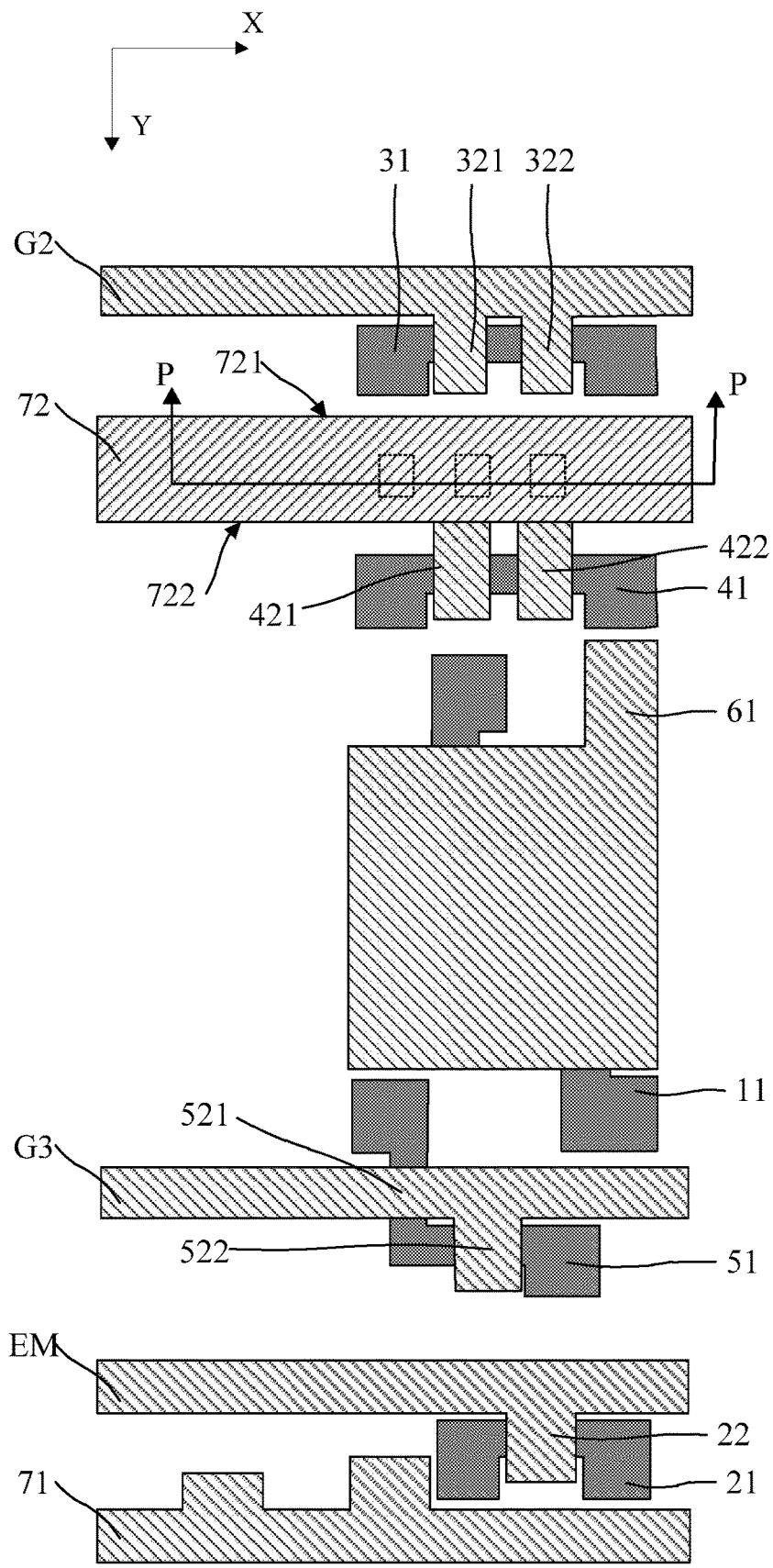
FIG. 13 is a schematic diagram of a sub-pixel after a second metal layer pattern is formed according to at least one embodiment of the present disclosure.
Figure 14:
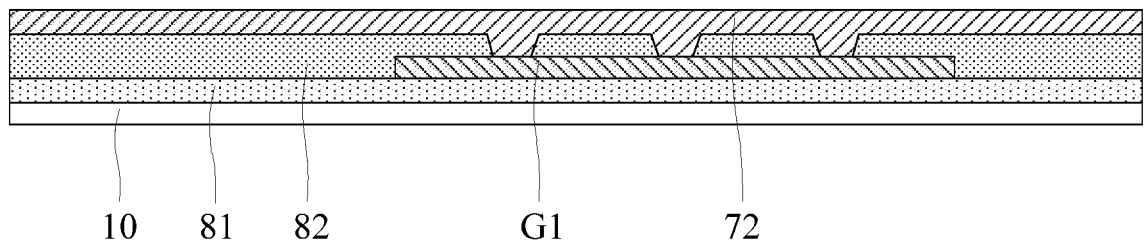
FIG. 14 is a schematic sectional view along P-P direction in FIG. 13.

In some exemplary embodiments, a second metal thin film is deposited on the substrate 10 with the aforementioned patterns are formed, and the second metal thin film is patterned through a patterning process to form a pattern of a second metal layer on a second insulating layer 82. As shown in FIGS. 13 and 14, the second metal layer pattern includes a scan connection line 72. The scan connection line 72 includes a flat fourth edge 721 and a flat fifth edge 722. The fourth edge 721 is an upper edge of the scan connection line 72 and the fifth edge 722 is a lower edge of the scan connection line 72. A projection of the scan connection line 72 on the substrate 10 may include a projection of the scan line G1 on the substrate 10. For example, a projection of the fourth edge 721 on the substrate 10 may overlap a projection of the first edge of the scan line G1 on the substrate 10, and a projection of the fifth edge 722 on the substrate 10 may overlap a projection of the third edge of the first protrusion of the scan line G1 on the substrate 10. A projection of the scan connection line 72 on the substrate 10 and projections of the fifth gate electrode 421 and the sixth gate electrode 422 on the substrate 10 does not have to overlap. The scan connection line 72 is electrically connected to the scan line G1 through a plurality of first vias (for example three first vias V1). By narrowing the scan line G1 and electrically connecting the scan line G1 and the scan connection line 72, the resistance of the scan line G1 may be greatly reduced without increasing the parasitic capacitance, thereby reducing the loading of the scan line and ensuring that the driving function of the scan line is normal.

(5) A Pattern of a Third Metal Layer is Formed.

Figure 15:
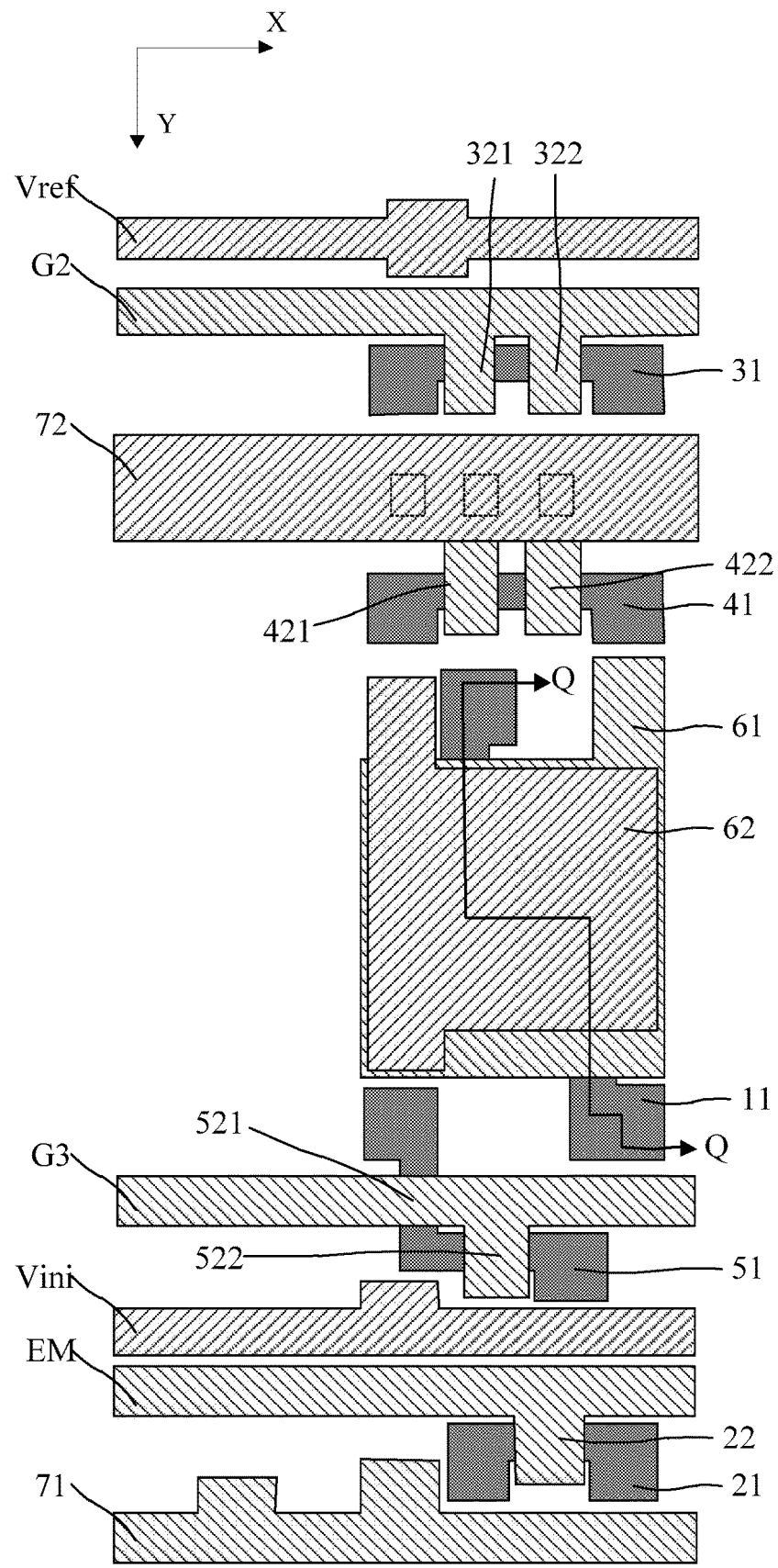
FIG. 15 is a schematic diagram of a sub-pixel after a third metal layer pattern is formed according to at least one embodiment of the present disclosure.
Figure 16:
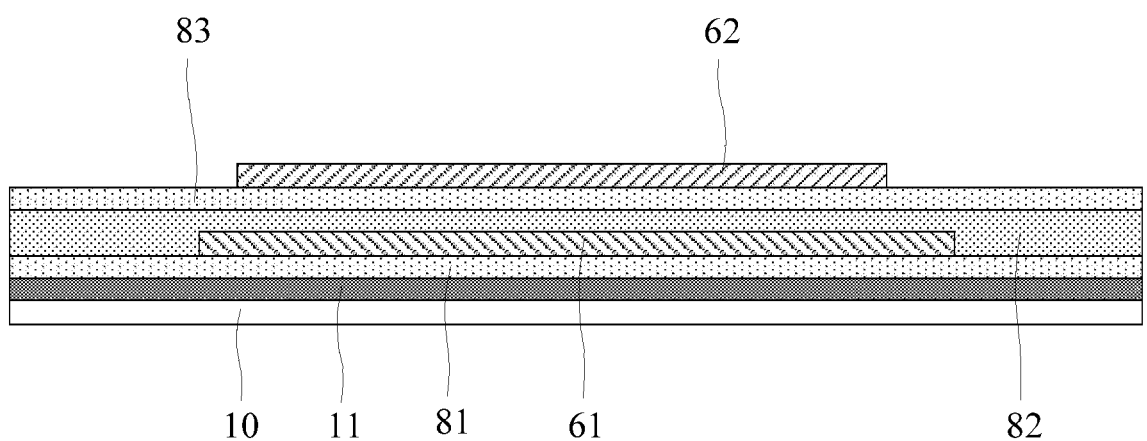
FIG. 16 is a schematic sectional view along Q-Q direction in FIG. 15.

In some exemplary embodiments, a third insulating film and a third metal film are sequentially deposited on the substrate 10 formed with the aforementioned patterns, and the third metal film is patterned through a patterning process to form a third insulating layer 83 covering the second metal layer and a pattern of the third metal layer formed on the third insulating layer 83. As shown in FIGS. 15 and 16, the pattern of the third metal layer includes a reference voltage line Vref, an initial voltage line Vini, and a second capacitor plate 62. Both the reference voltage line Vref and the initial voltage line Vini extend in the X direction. A projection of the reference voltage line Vref on the substrate 10 is located on the side of a projection of the first control signal line G2 on the substrate 10 away from a projection of the scan connection line 72 on the substrate 10. A projection of the initial voltage line Vini on the substrate 10 is located between a projection of the second control signal line G3 and a projection of the emitting control line EM on the substrate 10. The projection of the second capacitor plate 62 on the substrate 10 overlaps with the projection of the first capacitor plate 61 on the substrate 10.

In some exemplary embodiments, as shown in FIG. 15, the reference voltage line Vref includes an upper edge provided with a third protrusion and a lower edge provided with a fourth protrusion. A third protrusion is provided on an upper edge of the reference voltage line Vref and extends in a direction away from the upper edge. The fourth protrusion is provided at the lower edge of the reference voltage line Vref and extends in a direction away from the lower edge. The positions of the third protrusion and the fourth protrusion correspond to each other. However, this embodiment is not limited thereto. In some examples, the reference voltage line may include a flat upper edge and a flat lower edge.

In some exemplary embodiments, as shown in FIG. 15, the initial voltage line Vini includes an upper edge provided with a fifth protrusion and a flat lower edge. The fifth protrusion is provided on the upper edge of the initial voltage line Vini and extends in a direction away from the upper edge. However, this embodiment is not limited thereto. In some examples, the initial voltage line may include a flat upper edge and a flat lower edge.

(6) A Pattern of a Fourth Insulating Layer is Formed.

Figure 17:
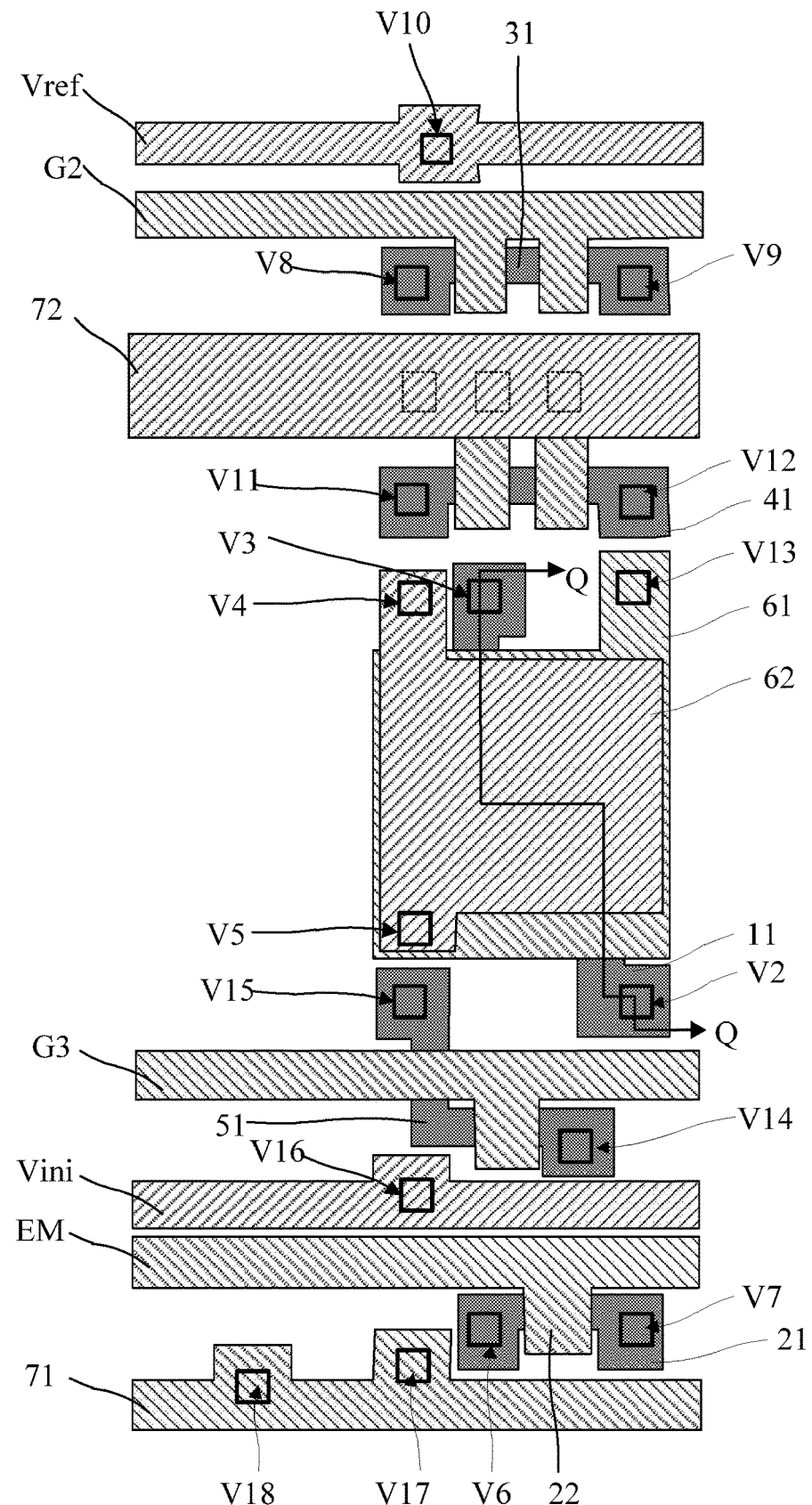
FIG. 17 is a schematic diagram of a sub-pixel after a fourth insulating layer pattern is formed according to at least one embodiment of the present disclosure.
Figure 18:
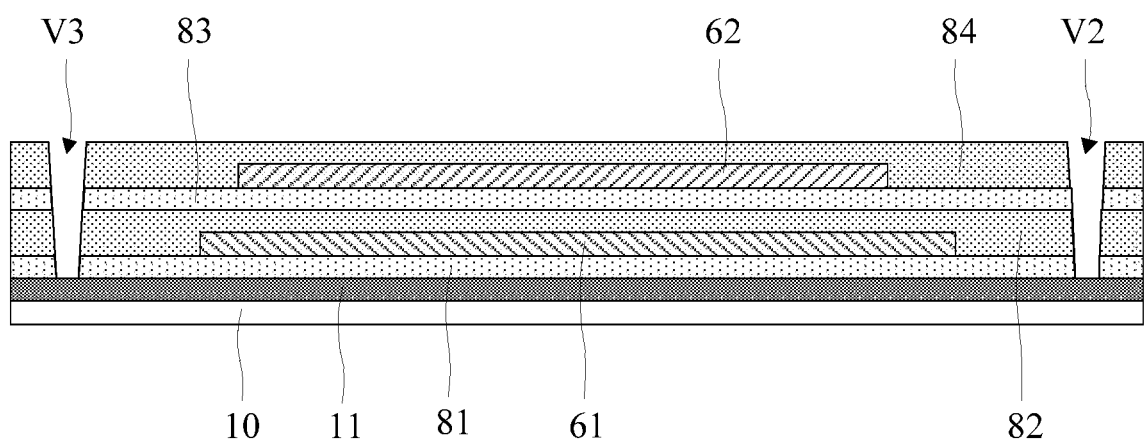
FIG. 18 is a schematic sectional view along Q-Q direction in FIG. 17.

In some exemplary embodiments, a fourth insulating thin film is deposited on the substrate 10 on which the aforementioned patterns are formed, and the fourth insulating thin film is patterned through a patterning process to form a pattern of a fourth insulating layer 84 covering the aforementioned structures. As shown in FIGS. 17 and 18, the fourth insulating layer 84 is provided with a plurality of via patterns, and the plurality of via patterns include a second via V2 and a third via V3 located on both sides of the first capacitor plate 61 respectively, a fourth via V4 and a fifth via V5 located at both ends of the second capacitor plate 62 respectively, a sixth via V6 and a seventh via V7 located on both sides of the second gate electrode 22 respectively, an eighth via V8 and a ninth via V9 located on both sides of the third gate electrode 321 and the fourth gate electrode 322 respectively, a tenth via V10 located at the position where the reference voltage line Vref is located, an eleventh via V11 and a twelfth via V12 located on both sides of the fifth gate electrode 421 and the sixth gate electrode 422 respectively, a thirteenth via V13 located at the position of the first capacitor plate 61 and adjacent to the fourth active layer 41, a fourteenth via V14 and a fifteenth via V15 located on both sides of the second control signal line G3 respectively, a sixteenth via V16 located at the position of the fifth protrusion of the initial voltage line Vini, a seventeenth via V17 located at the position of the second protrusion of the power connection line 71, and an eighteenth via V18 located at the position of the first protrusion. The fourth insulating layer 84, the third insulating layer 83, the second insulating layer 82 and the first insulating layer 81 in the second via V2 and the third via V3 are etched away, exposing the surfaces of both ends of the first active layer 11. The fourth insulating layer 84 in the fourth via V4 and the fifth via V5 is etched away, exposing the surfaces of both ends of the second capacitor electrode plate 62. The fourth insulating layer 84, the third insulating layer 83, the second insulating layer 82 and the first insulating layer 81 in the sixth via V6 and the seventh via V7 are etched away, exposing the surfaces of both ends of the second active layer 21. The fourth insulating layer 84, the third insulating layer 83, the second insulating layer 82 and the first insulating layer 81 in the eighth via V8 and the ninth via V9 are etched away, exposing the surfaces of both ends of the third active layer 31. A fourth insulating layer in the tenth via V10 is etched away to expose the surface of the reference voltage line Vref. The fourth insulating layer 84, the third insulating layer 83, the second insulating layer 82 and the first insulating layer 81 in the eleventh via V11 and the twelfth via V12 are etched away, exposing the surfaces of both ends of the fourth active layer 41. The fourth insulating layer 84, the third insulating layer 83, and the second insulating layer 82 in the thirteenth via V13 are etched off to expose a surface of the first capacitor electrode plate 61. The fourth insulating layer 84, the third insulating layer 83, the second insulating layer 82 and the first insulating layer 81 in the fourteenth via V14 and the fifteenth via V15 are etched away, exposing the surfaces of both ends of the fifth active layer 51. A fourth insulating layer 84 in the sixteenth via V16 is etched away to expose the surface of the initial voltage line Vini. The fourth insulating layer 84, the third insulating layer 83 and the second insulating layer 82 in the seventeenth via V17 and the eighteenth via 82 are etched away to expose the surface of the power connection line 71. In some examples, the vias described above may be rectangular or circular. However, this embodiment is not limited thereto.

(7). A Pattern of a Fourth Metal Layer is Formed.

Figure 19:
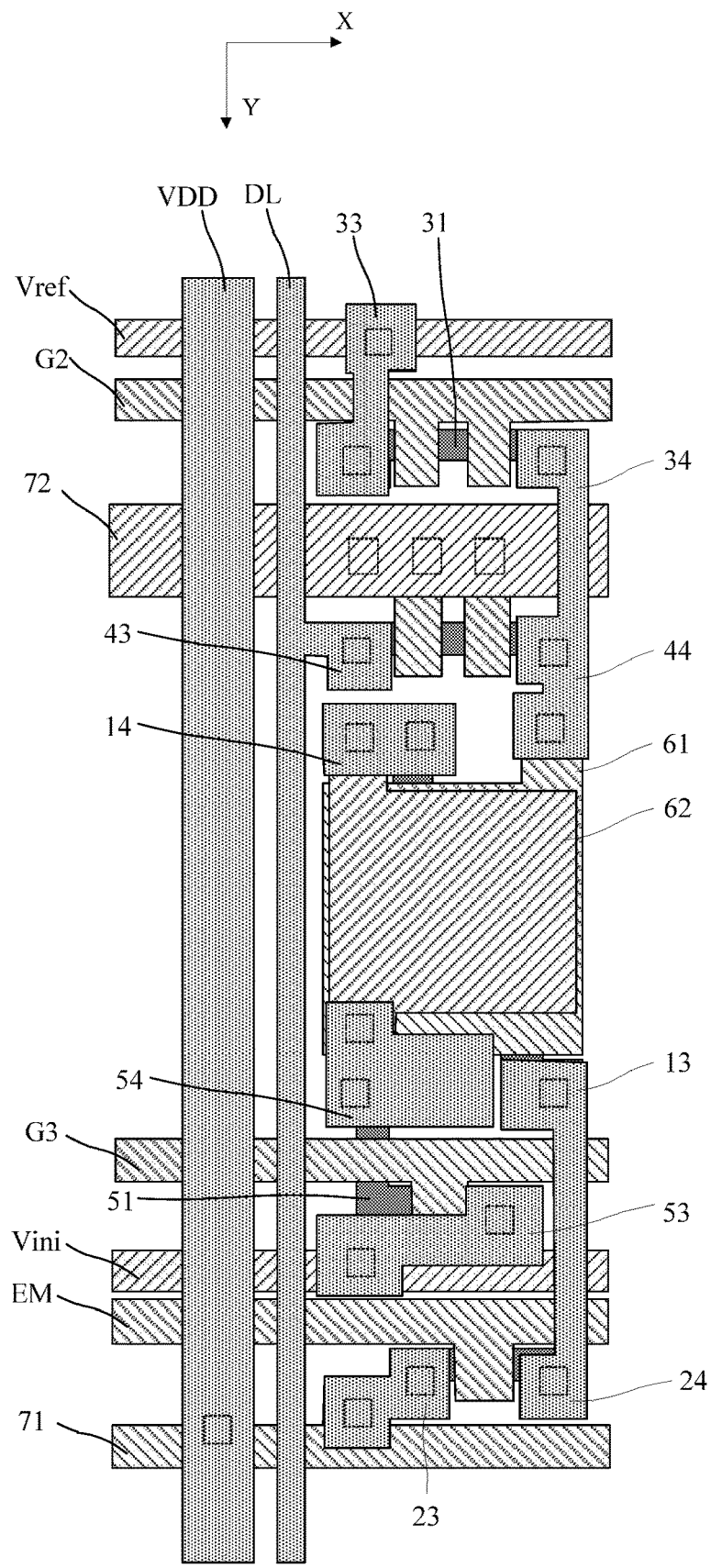
FIG. 19 is a schematic diagram of a sub-pixel after a fourth metal layer pattern is formed according to at least one embodiment of the present disclosure.

In some exemplary embodiments, a fourth metal thin film is deposited on the substrate 10 with the aforementioned patterns are formed, and the fourth metal thin film is patterned through a patterning process to form a pattern of a fourth metal layer on a fourth insulating layer 84. As shown in FIG. 19, the pattern of the fourth metal layer includes a data line DL, a first power supply line VDD, a first source electrode 13, a first drain electrode 14, a second source electrode 23, a second drain electrode 24, a third source electrode 33, a third drain electrode 34, a fourth source electrode 43, a fourth drain electrode 44, a fifth source electrode 53, and a fifth drain electrode 54. The data line DL and the first power supply line VDD extend along a Y direction. The first power supply line VDD is located on the side of the data line DL away from the first capacitor plate 61. The first source electrode 13 is connected to a first end of the first active layer 11 through a second via V2, the first drain electrode 14 is connected to the second end of the first active layer 11 through a third via V3, and the first drain electrode 14 is also connected to the second capacitor plate 62 through a fourth via V4. The second source electrode 23 is connected to a first end of the second active layer 21 through a sixth via V6, and the second source electrode 23 is also connected to a power connection line 71 through a seventeenth via V17. The second drain electrode 24 is connected to the second end of the second active layer 21 through the seventh via V7, and is also connected to the first source electrode 13. The second drain electrode 24 and the first drain electrode 13 may be integrated. The third source electrode 33 is connected to a first end of the third active layer 31 through an eighth via V8, and the third source electrode 33 is also connected to a reference voltage line Vref through a tenth via V10. The third drain electrode 34 is connected to the second end of the third active layer 31 through the ninth via V9. The fourth source electrode 43 is connected to a first end of the fourth active layer 41 through an eleventh via V11, and the fourth source electrode 43 is also connected to the data line DL. The fourth source electrode 43 and the data line DL may be integrated. The fourth drain electrode 44 is connected to the second end of the fourth active layer 41 through a twelfth via V12, and the fourth drain electrode 44 is also connected to the first capacitor plate 61 through a thirteenth via V13. The third drain electrode 34 and the fourth drain electrode 44 are connected, and the third drain electrode 34 and the fourth drain electrode 44 may be an integral structure. The fifth source electrode 53 is connected to a first end of the fifth active layer 51 through a fourteenth via V14, and is also electrically connected to an initial voltage line Vini through a sixteenth via V16. The fifth drain electrode 54 is connected to a second end of the fifth active layer 51 through a fifteenth via V15, and the fifth drain electrode 54 is also connected to the second capacitor plate 62 through a fifth via V5.

In some exemplary embodiments, as shown in FIGS. 3-5 and 19, a projection of the scan line G1 overlaps a projection of the data line DL, the first power supply line VDD, and the third drain electrode 34 on the substrate 10. A region of the scan line G1 whose projection overlaps with a projection of the fourth metal layer on the substrate 10 is a first part of the scan line G1, and a region of the scan line G1 whose projection does not overlap with a projection of the fourth metal layer on the substrate 10 is a second part of the scan line G1. The average length of the second part along the Y direction is larger than the average length of the first part along the Y direction. By narrowing the scan line G1 according to the overlapping region of a projection of the scan line G1 and the fourth metal layer, the space may be optimized and the parasitic capacitance of the scan line may be reduced.

(8) A Pattern of a Fifth Metal Layer is Formed.

Figure 20:
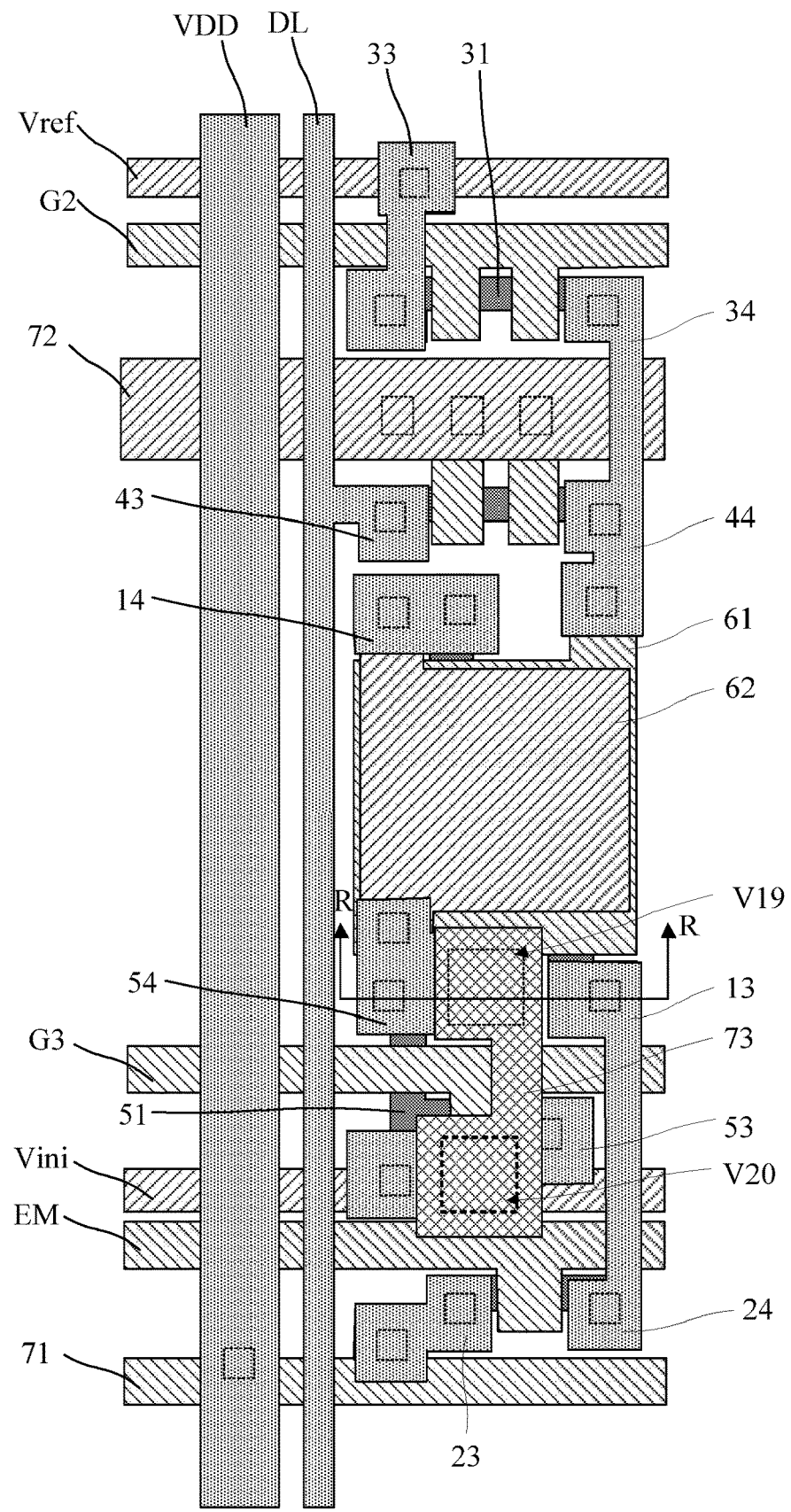
FIG. 20 is a schematic diagram of a sub-pixel after a fifth metal layer pattern is formed according to at least one embodiment of the present disclosure.
Figure 21:
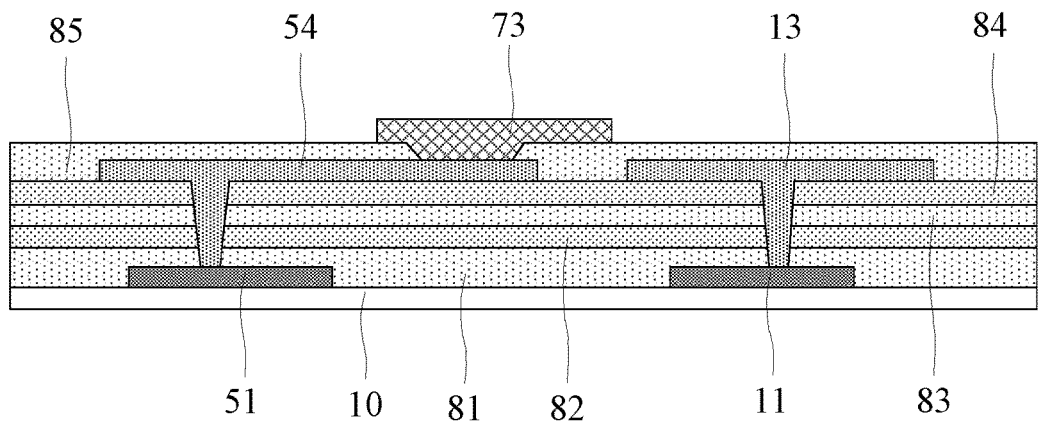
FIG. 21 is a schematic sectional view along R-R direction in FIG. 20.

In some exemplary embodiments, a fifth insulating film is coated on the substrate 10 on which the aforementioned patterns are formed, a pattern of the fifth insulating layer is formed by masking, exposing and developing the fifth insulating film, and then a fifth metal film is deposited on the fifth insulating layer and is patterned through a patterning process to form a pattern of the fifth metal layer. As shown in FIGS. 20 and 21, the fifth insulating layer 85 is provided with a plurality of via patterns, including at least a nineteenth via V19 at a position where the fifth drain electrode 54 is located. The fifth insulating layer 85 in the nineteenth via V19 is etched away, exposing the surface of the fifth drain electrode 54. The pattern of the fifth metal layer at least includes a connection electrode 73. The connection electrode 73 is connected to the fifth drain electrode 54 through the nineteenth via V19.

(9) Patterns of a Sixth Insulating Layer, an Anode, a Pixel Define Layer, an Organic Emitting Layer, a Cathode and an Encapsulation Layer are Formed.

In some exemplary embodiments, a sixth insulating film is coated on the substrate 10 on which the aforementioned patterns are formed, and a sixth insulating layer pattern is formed by masking, exposing and developing the sixth insulating film. The pattern of the via provided on the sixth insulating layer at least includes a twentieth via V20 located at a position where the connection electrode 73 is located. The sixth insulating layer in the twentieth via V20 is etched away, exposing the surface of the connection electrode 73. Then, an anode thin film is deposited on the substrate 10 on which the aforementioned patterns are formed, and the anode thin film is patterned through a patterning process to form a pattern of an anode on the sixth insulation layer. The anode may be connected to the connection electrode 73 through the twentieth via V20 to achieve the connection between the anode and the pixel drive circuit. Next, on the substrate 10 where the aforementioned patterns are formed, a pixel definition thin film is coated, and a pattern of a Pixel Definition layer (PDL) is formed through masking, exposure, and development processes. The pixel definition layer is formed in each sub-pixel in the display region. A pixel opening exposing the anode is formed in the pixel definition layer in each sub-pixel. Subsequently, the organic emitting layer connected to the anode is formed in the pixel opening formed before. Subsequently, a cathode thin film is deposited and patterned through a patterning process to form a pattern of a cathode. The cathode is connected to the organic emitting layer and the second power supply line VSS respectively. Subsequently, the encapsulation layer is formed on the cathode. The encapsulation layer may include a stacked structure of an inorganic material/an organic material/an inorganic material. In some possible implementations, the second power supply line VSS may be disposed on the same layer as the connection electrode 73, and the cathode may be connected to the second power supply line VSS in various ways, such as laser drilling and the like.

In some exemplary embodiments, the first metal layer, the second metal layer, the third metal layer, the fourth metal layer, and the fifth metal layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure such as Mo/Cu/Mo. The first insulating layer 81, the second insulating layer 82, the third insulating layer 83, and the fourth insulating layer 84 may be made of any one or more of silicon oxide (SiOx), silicon nitride (SiNx), and silicon oxynitride (SiON), and may be a single layer, multiple layers, or a composite layer. The first insulating layer 81 is referred to as a buffer layer, which is used for improving capabilities of water-resistance and oxygen-resistance of the substrate. The second insulating layer 82 and the third insulating layer 83 are referred to as gate insulating (GI) layers. The fourth insulating layer 84 is referred to as an interlayer insulating (ILD) layer. The fifth insulating layer 85 and the sixth insulating layer may be made of an organic material, such as polyimide, acrylic, or polyethylene terephthalate. The fifth insulating layer 85 and the sixth insulating layer are referred to as planarization layers. The pixel definition layer may be made of an organic material, such as polyimide, acrylic, or polyethylene terephthalate. The anode may be made of a transparent conductive material, e.g., Indium Tin Oxide (ITO) or Indium Zinc Oxide (IZO). The cathode may be made of any one or more of Magnesium (Mg), Argentum (Ag), Aluminum (Al), Copper (Cu), and Lithium (Li), or an alloy made of any one or more of the aforementioned metals. However, this embodiment is not limited thereto. For example, the anode may be made of a reflective material such as a metal, and the cathode may be made of a transparent conductive material.

The structure and its preparation process in the present disclosure are only exemplary description. In some exemplary embodiments, changes in corresponding structures and addition or deletion of patterning processes may be made according to actual needs. For example, the pixel drive circuit may be 3T1C or 7T1C design. As a further example, other electrodes or leads may further be provided in the film layer structure, which is not limited herein in the present disclosure.

As may be seen from the structure and preparation process of the display substrate described above, the display substrate provided by the embodiments of the present disclosure can use double-layer wirings (that is, the scan lines of the first metal layer and the scan connection lines of the second metal layer) to transmit scan signals used to control the writing of data signals. Furthermore, the scan line can be narrowed, so that the average length of the overlapping region of the scan line and the fourth metal layer along the second direction is smaller than the average length of the region where the scan line and the fourth metal layer do not overlap along the second direction. In this way, the resistance of the scan line may be greatly reduced without increasing the parasitic capacitance of the scan line, thereby reducing the loading and ensuring the driving function requirement. In some examples, the driving requirements of medium and large size products with high PPI may be met.

The preparation process according to the embodiments of the present disclosure may be achieved by using the existing mature preparation equipment, may be well compatible with the existing preparation process, and has advantages of simple process realization, easy implementation, high production efficiency, low production cost and high yield rate.

Figure 22:
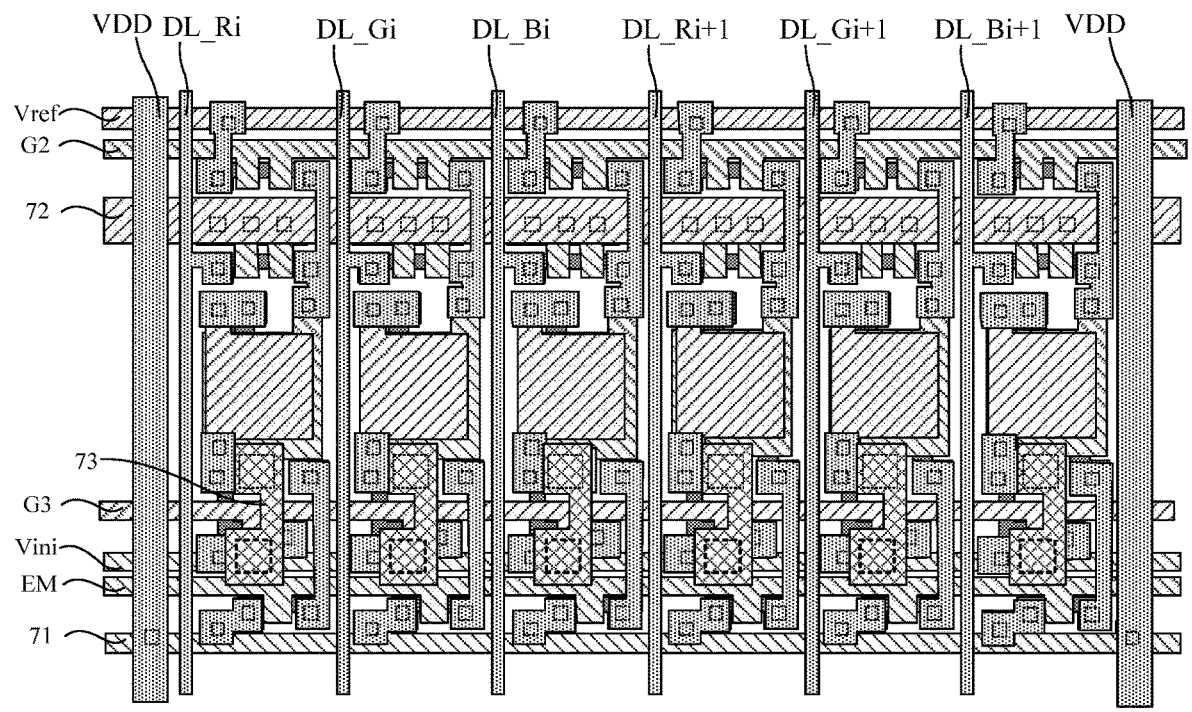
FIG. 22 is a top view of a plurality of sub-pixels of a display substrate according to at least one embodiment of the present disclosure.

FIG. 22 is a top view of a plurality of sub-pixel of a display substrate according to at least one embodiment of the present disclosure. As shown in FIG. 22, six sub-pixels of the display substrate are illustrated as an example. Six columns of sub-pixels are arranged between two adjacent first power supply lines VDD, and each column of sub-pixels is indicated by one sub-pixel. For example, an i-th red sub-pixel Ri, an i-th green sub-pixel Gi, an i-th blue sub-pixel Bi, an i+1 red sub-pixel Ri+1, an i+1 green sub-pixel Gi+1, and an i-+1 blue sub-pixel Bi+1 are sequentially arranged between two adjacent first power supply lines VDD. The structure of the pixel drive circuit of each sub-pixel may be the same. In the exemplary embodiment, the first power supply line VDD may be designed as a "one drives six" structure, and the size of each sub-pixel may be effectively increased under the same PPI, which has the advantages of fully utilizing layout space, reasonable overall layout and the like.

In some exemplary embodiments, The display substrate include: a substrate, and a semiconductor layer, a first metal layer, a second metal layer, a third metal layer, a fourth metal layer and a fifth metal layer which are sequentially arranged on the substrate. The first insulating layer is arranged between the semiconductor layer and the first metal layer, the second insulating layer is arranged between the first metal layer and the second metal layer, the third insulating layer is arranged between the second metal layer and the third metal layer, and the fourth insulating layer is arranged between the third metal layer and the fourth metal layer. A fifth insulating layer is disposed between the fourth metal layer and the fifth metal layer.

Figure 23:
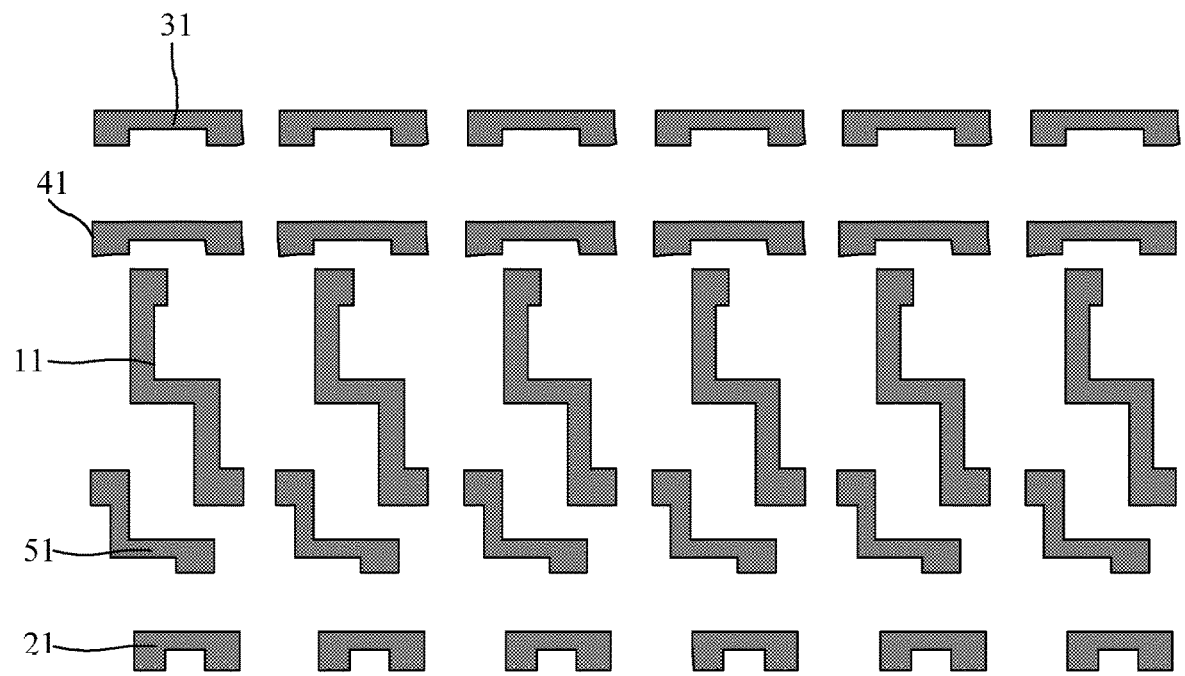
FIG. 23 is a schematic diagram of a plurality of sub-pixels after a semiconductor layer pattern is formed according to at least one embodiment of the present disclosure.

In some exemplary embodiments as shown in FIG. 23, the semiconductor layer has a curved or bent shape. The semiconductor layer may include a plurality of first active layers 11, a plurality of second active layers 21, a plurality of third active layers 31, a plurality of fourth active layers 41, and a plurality of fifth active layers 51. The structure of the semiconductor layer of the pixel drive circuit of each sub-pixel may be the same.

Figure 24:
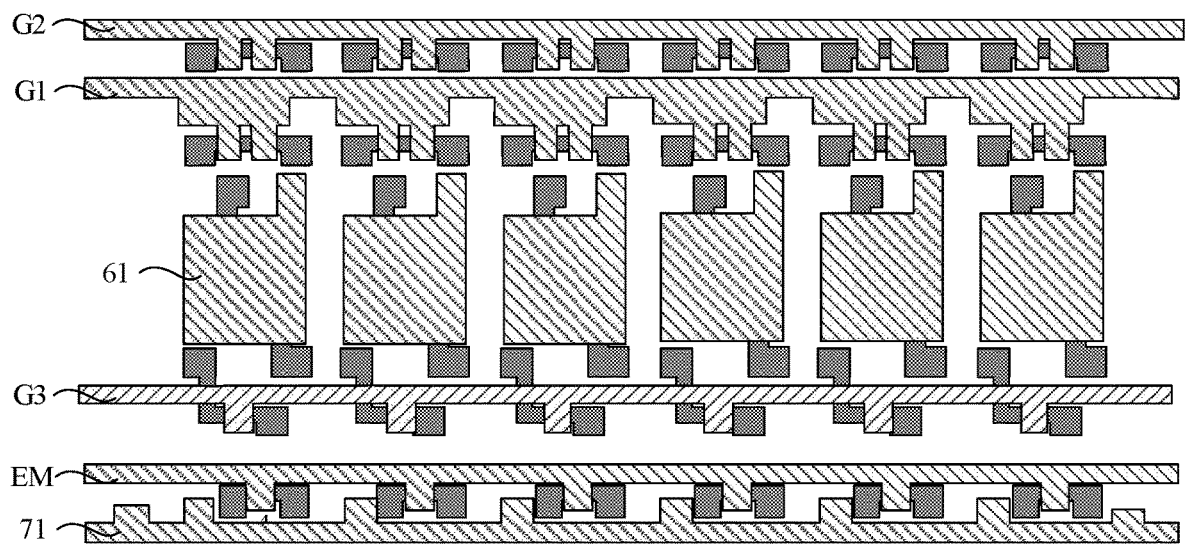
FIG. 24 is a schematic diagram of a plurality of sub-pixels after a first metal layer pattern is formed according to at least one embodiment of the present disclosure.

In some exemplary embodiments, as shown in FIG. 24, the first metal layer may include a scan line G1, a first control signal line G2, a second control signal line G3, an emitting control line EM, a power connection line 71, a first capacitor plate 61, and gate electrodes of a plurality of transistors. The scan line G1, the first control signal line G2, the second control signal line G3, the emitting control line EM, and the power connection line 71 all extend in the first direction. The first control signal line G2 and the second control signal line G3 are located on both sides of the scan line G1 respectively, the emitting control line EM is located on the side of the second control signal line G3 away from the scan line G1, and the power connection line 71 is located on the side of the emitting control line EM away from the scan line G1. The first capacitor plate 61 is integrated with the gate electrode of the first transistor, the scan line G1 is integrated with the gate electrode of the fourth transistor, the first control signal line G2 is integrated with the gate electrode of the third transistor, the second control signal line G3 is integrated with the gate electrode of the fifth transistor, and the emitting control line EM is integrated with the gate electrode of the second transistor.

Figure 25:
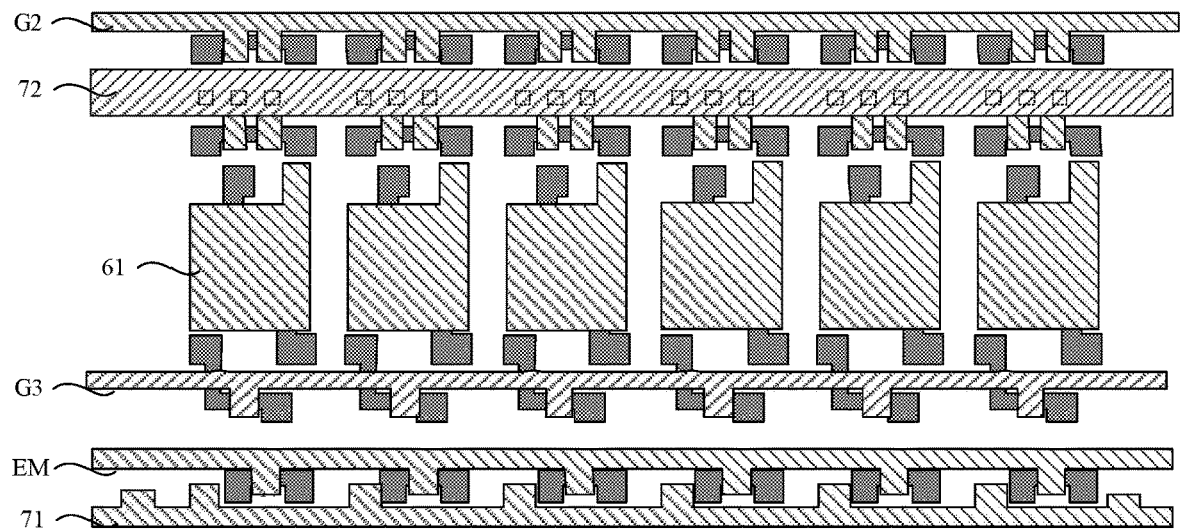
FIG. 25 is a schematic diagram of a plurality of sub-pixels after a second metal layer pattern is formed according to at least one embodiment of the present disclosure.

In some exemplary embodiments, as shown in FIG. 25, the second metal layer may include a scan connection line 72 extending in a first direction. A projection of the scan connection line 72 on the substrate includes a projection of the scan line G1 on the substrate, and may not overlap with the gate electrode of the fourth transistor. The scan connection line 72 may be connected to the scan line G1 through a plurality of first vias (for example three first vias).

Figure 26:
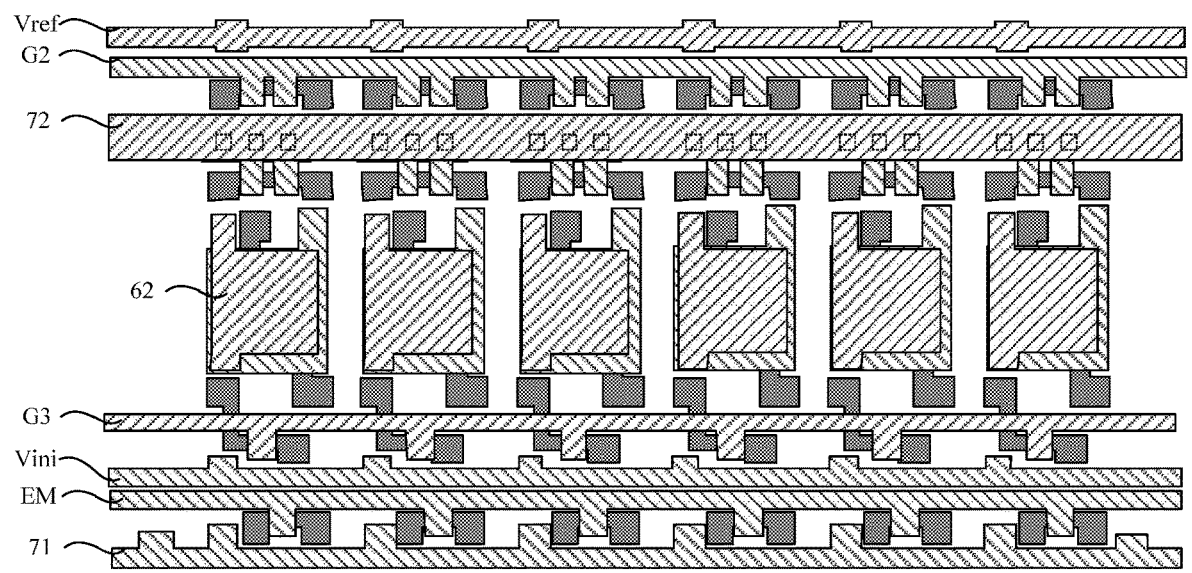
FIG. 26 is a schematic diagram of a plurality of sub-pixels after a third metal layer pattern is formed according to at least one embodiment of the present disclosure.

In some exemplary embodiments, as shown in FIG. 26, the third metal layer may include a reference voltage line Vref, an initial voltage line Vini, and a second capacitor plate 62. Both the reference voltage line Vref and the initial voltage line Vini extend in the first direction. The reference voltage line Vref may be located on the side of the first control signal line G2 away from the scan line G1, and the initial voltage line Vini may be located between the second control signal line G3 and the emitting control line EM. The position of the second capacitor plate 62 corresponds to the position of the first capacitor plate 61.

Figure 27:
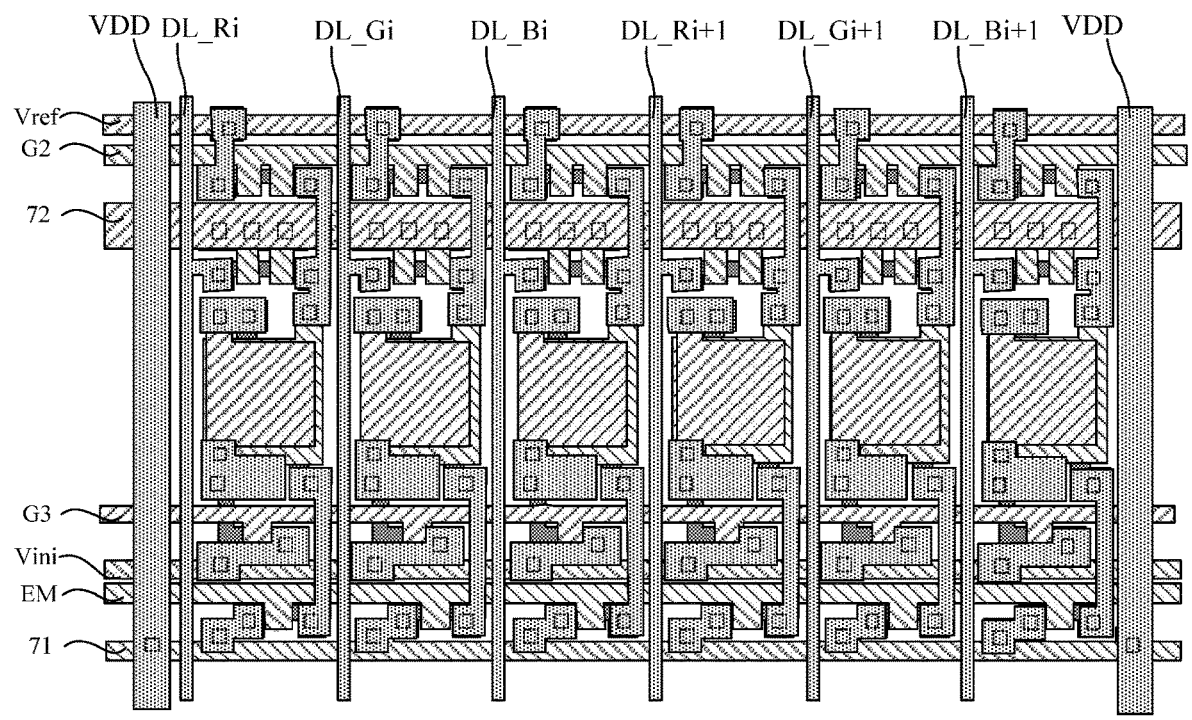
FIG. 27 is a schematic diagram of a plurality of sub-pixels after a fourth metal layer pattern is formed according to at least one embodiment of the present disclosure.

In some exemplary embodiments, as shown in FIG. 27, the fourth metal layer may include: a first power supply line VDD, a data line corresponding to each column of sub-pixels (e.g., a data line DL_Ri corresponding to an i-th red sub-pixel Ri, a data line DL_Gi corresponding to an i-th green sub-pixel Gi, a data line DL_Bi corresponding to an i-th blue sub-pixel Bi, a data line DL_Ri+1 corresponding to an i+1 red sub-pixel Ri+1, a data line DL_Gi+1 corresponding to an i+1 green sub-pixel Gi+1, a data line DL_Bi+1 corresponding to an i+1 blue sub-pixel Bi+1), and source-drain electrodes of a plurality of transistors. The data line corresponding to each column of sub-pixels may be located on the left of the sub-pixels. The first power supply line VDD and the data line extend in a second direction, which is perpendicular to the first direction. The structure of source electrodes and drain electrodes of a plurality of transistors of the pixel drive circuit of each sub-pixel may be the same.

In some exemplary embodiments, as shown in FIG. 22, the fifth metal layer may at least include a connection electrode 73. The connection electrode 73 may connect the pixel drive circuit of the sub-pixel and the first electrode of the light emitting element. However, this embodiment is not limited thereto.

The detailed structure of the pixel drive circuit for each sub-pixel may be described with reference to the above-described embodiment so that the details will not be repeated here.

At least one embodiment of the present disclosure further provides a method for preparing a display substrate. The display substrate includes a substrate and a plurality of sub-pixels disposed on the substrate. At least one sub-pixel of the plurality of sub-pixels includes a pixel drive circuit and a light emitting element electrically connected to the pixel drive circuit; the pixel drive circuit includes a plurality of transistors and at least one storage capacitor; The preparation method of the embodiment includes sequentially forming a semiconductor layer, a first metal layer, a second metal layer, a third metal layer and a fourth metal layer on the substrate. Wherein, the semiconductor layer includes active layers of a plurality of transistors. The first metal layer at least includes scan lines extending in a first direction, gate electrodes of the plurality of transistors, and a first capacitor plate of the storage capacitor. The second metal layer at least includes a scan connection line extending in the first direction. An insulating layer between the second metal layer and the first metal layer is provided with a first via, and the scan connection line contacts the scan line exposed through the first via. The third metal layer at least includes a second capacitor plate of the storage capacitor. The fourth metal layer at least includes a data line extending in a second direction perpendicular to the first direction and a source drain electrode of the plurality of transistors. The scan line includes a first part and a second part connected in sequence along a first direction. A projection of the first part on the substrate overlaps a projection of the fourth metal layer on the substrate, a projection of the second part on the substrate does not overlap a projection of the fourth metal layer on the substrate, and an average length of the second part in the second direction is greater than an average length of the first part in the second direction.

In some exemplary embodiments, sequentially forming a semiconductor layer, a first metal layer, a second metal layer, a third metal layer and a fourth metal layer on the substrate includes: forming a semiconductor layer on the substrate, wherein the semiconductor layer includes: a first active layer of a first transistor, a second active layer of a second transistor, a third active layer of a third transistor, a fourth active layer of a fourth transistor, and a fifth active layer of a fifth transistor; forming a first insulating layer covering the semiconductor layer; forming a first metal layer on the first insulating layer, wherein the first metal layer includes: a scan line, a first control signal line, a second control signal line, a light-emitting control line, a power supply connection line, a first capacitor plate of a storage capacitor, and gate electrodes of a plurality of transistors; forming a second insulating layer covering the first metal layer, wherein a first via exposing the scan line is formed on the second insulating layer; forming a second metal layer on the second insulating layer, wherein the second metal layer includes a scan connection line, and the scan connection line is connected to the scan line through the first via; forming a third insulating layer covering the second metal layer; forming a third metal layer on the third insulating layer, wherein the third metal layer includes a second capacitor plate of the storage capacitor; forming a fourth insulating layer covering the third metal layer; and forming a fourth metal layer on the fourth insulating layer. A plurality of vias are formed on the fourth insulating layer, The plurality of vias include: a second via and the third via exposing both ends of the first active layer, a fourth via and a fifth via exposing both ends of the second capacitor plate, a sixth via and a seventh via exposing both ends of the second active layer, an eighth via and a ninth via exposing both ends of the third active layer, a tenth via exposing the reference voltage line, an eleventh via and a twelfth via exposing both ends of the fourth active layer, and a thirteenth via exposing the first capacitor plate, a fourteenth via and a fifteenth via exposing both ends of the fifth active layer, a sixteenth via exposing the initial voltage line, and a seventeenth via and an eighteenth via exposing the power connection line. The fourth metal layer includes a data line, a first power supply line, a first source electrode, a first drain electrode, a second source electrode, a second drain electrode, a third source electrode, a third drain electrode, a fourth source electrode, a fourth drain electrode, a fifth source electrode and a fifth drain electrode. The first source electrode is connected to the first end of the first active layer through the second via, the first drain electrode is connected to the second end of the first active layer through the third via, The first drain electrode is connected to the second capacitor plate through the fourth via, the second source electrode is connected to the first end of the second active layer through the sixth via, the second source electrode is connected to the power connection line through the seventeenth via, the second drain electrode is connected to the second end of the second active layer through the seventh via, the second drain electrode is connected to the first source electrode, the third source electrode is connected to the first end of the third active layer through the eighth via, the third source electrode is connected to the reference voltage line through the tenth via, the third drain electrode is connected to the second end of the third active layer through the ninth via, the fourth source electrode is connected to the first end of the fourth active layer through the eleventh via, the fourth source electrode is connected to the data line, the fourth drain electrode is connected to the second end of the fourth active layer through the twelfth via, the fourth drain electrode is connected to the first capacitor plate through the thirteenth via, the third drain electrode and the fourth drain electrode are connected, the fifth source electrode is connected to the first end of the fifth active layer through the fourteenth via, the fifth source electrode is electrically connected to the initial voltage line through the sixteenth via, the fifth drain electrode is connected to the second end of the fifth active layer through the fifteenth via, and the fifth drain electrode is also connected to the second capacitor plate through the fifth via.

In some exemplary embodiments, the preparation method of the present embodiment further includes forming a fifth insulating layer covering the fourth metal layer; forming a fifth metal layer on the fifth insulating layer, wherein the fifth metal layer includes a connection electrode connected to a fifth drain electrode of the fifth transistor; forming a sixth insulating layer covering the fifth metal layer; and forming a light emitting element on the sixth insulating layer, wherein an anode of the light emitting element is connected to the connection electrode, and a cathode of the light emitting element is connected to the second power supply line.

The preparation method of this embodiment may refer to the descriptions in the above-mentioned embodiments, and thus will not be repeated herein.

Figure 28:
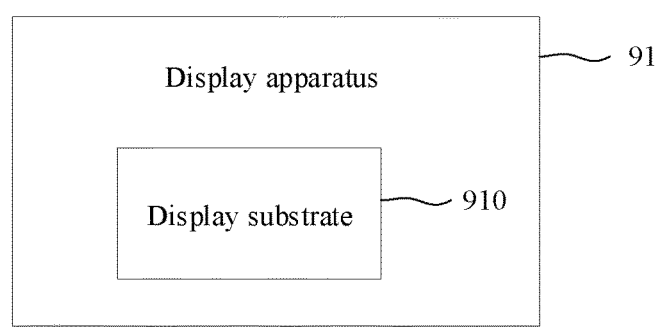
FIG. 28 is a schematic diagram of a structure of a display apparatus according to at least one embodiment of the present disclosure.

FIG. 28 is a schematic diagram of a display apparatus according to at least one embodiment of the present disclosure. As shown in FIG. 28, the embodiment provides a display apparatus 91, which includes a display substrate 910. The display substrate 910 is the display substrate provided in the above-mentioned embodiments. Herein, the display substrate 910 may be an OLED display substrate. The display apparatus 91 may be any product or component with a display function, such as an OLED display apparatus, a mobile phone, a tablet computer, a television, a display, a notebook computer, a digital photo frame, and a navigator. However, this embodiment is not limited thereto.

The drawings of the present disclosure only involve the structures involved in the present disclosure, and other structures may refer to conventional designs. The embodiments of the present disclosure and features in the embodiments may be combined to each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
a substrate and a plurality of sub-pixels disposed on the substrate, wherein:
at least one of the plurality of sub-pixels comprises a pixel drive circuit and a light emitting element electrically connected to the pixel drive circuit; the pixel drive circuit comprises a plurality of transistors and at least one storage capacitor;
in a direction perpendicular to the substrate, the display substrate comprises a semiconductor layer, a first metal layer, a second metal layer, a third metal layer and a fourth metal layer arranged on the substrate sequentially;
the semiconductor layer comprises active layers of the plurality of transistors;
the first metal layer at least comprises a scan line extending in a first direction, gate electrodes of the plurality of transistors, and a first capacitor plate of the storage capacitor;
the second metal layer at least comprises a scan connection line extending along the first direction, wherein an insulating layer between the second metal layer and the first metal layer is provided with a first via, and the scan connection line is in contact with the scan line exposed through the first via;
the third metal layer at least comprises a second capacitor plate of the storage capacitor;
the fourth metal layer at least comprises a data line extending in a second direction perpendicular to the first direction; source electrodes and drain electrodes of the plurality of transistors;
the scan line comprises a first part and a second part connected in sequence along a first direction, a projection of the first part on the substrate is overlapped with a projection of the fourth metal layer on the substrate, a projection of the second part on the substrate is not overlapped with the projection of the fourth metal layer on the substrate, and an average length of the second part in the second direction is greater than an average length of the first part in the second direction;
the pixel drive circuit comprises a first transistor, a second transistor, a third transistor, a fourth transistor, a fifth transistor and a storage capacitor;
a gate electrode of the first transistor is connected to a second electrode of the third transistor, the first capacitor plate of the storage capacitor and a second electrode of the fourth transistor, a first electrode of the first transistor is connected to a second electrode of the second transistor, a second electrode of the first transistor is connected to the second capacitor plate of the storage capacitor, a first electrode of the fifth transistor and a first electrode of the light emitting element;

a gate electrode of the second transistor is connected to an emitting control line, and a first electrode of the second transistor is connected to a first power supply line;

a gate electrode of the third transistor is connected to a first control signal line, and a first electrode of the third transistor is connected to a reference voltage line;

a gate electrode of the fourth transistor is connected to the scan line, and a first electrode of the fourth transistor is connected to the data line; and a gate electrode of the fifth transistor is connected to a second control signal line, and a second electrode of the fifth transistor is connected to an initial voltage line;

the third transistor, the fourth transistor, and the fifth transistor are double gate transistors; each double gate transistor comprises two gate electrodes connected to each other; and the first capacitor plate of the storage capacitor and the gate electrode of the first transistor are integrally structured.

2. The display substrate of claim 1, wherein the first part has a first edge and a second edge extending in a first direction, the second part has a first edge and a third edge extending in a first direction, the second edge and the third edge are located on a same side of the first edge along the second direction, and the third edge is located on a side of the second edge away from the first edge.

3. The display substrate of claim 2, wherein the first edge is an upper edge of the first part and the second part, the second edge is a lower edge of the first part, and the third edge is a lower edge of the second part.

4. The display substrate of claim 1, wherein a projection of the scan connection line on the substrate comprises a projection of the scan line on the substrate.

5. The display substrate of claim 1, wherein a material of the first metal layer is molybdenum, and the second metal layer comprises a three-layer stacked structure formed of titanium, aluminum, and titanium.

6. The display substrate of claim 1, wherein the fourth metal layer further comprises a first power supply line extending in a second direction; and six columns of sub-pixels are provided between two adjacent first power supply lines.

7. The display substrate of claim 6, wherein the first metal layer further comprises a power connection line extending in a first direction, wherein the power connection line is connected to the first power supply line and the six columns of sub-pixels.

8. The display substrate of claim 1, further comprising a first insulating layer, a second insulating layer, a third insulating layer, and a fourth insulating layer, wherein
the first insulating layer is arranged between the semiconductor layer and the first metal layer, the second insulating layer is arranged between the first metal layer and the second metal layer, the third insulating layer is arranged between the second metal layer and the third metal layer, and the fourth insulating layer is arranged between the third metal layer and the fourth metal layer.

9. The display substrate of claim 1, further comprising a fifth metal layer disposed on a side of the fourth metal layer away from the substrate, wherein
the fifth metal layer at least comprises a connection electrode for electrically connecting the pixel drive circuit and the light emitting element.

10. The display substrate of claim 1, wherein:
the first metal layer further comprises a first control signal line, a second control signal line and an emitting control line;
the third metal layer further comprises a reference voltage line and an initial voltage line; and
the first control signal line, the second control signal line, the emitting control line, the reference voltage line and the initial voltage line all extend along the first direction.

11. The display substrate of claim 10, wherein:
in the second direction, the first control signal line and the second control signal line are located on both sides of the scan line respectively, and the emitting control line is located on a side of the second control signal line away from the scan line; and
a projection of the reference voltage line on the substrate is located on a side of a projection of the first control signal line on the substrate away from a projection of the scan line on the substrate, and a projection of the initial voltage line on the substrate is located between a projection of the second control signal line and a projection of the emitting control line on the substrate.

12. A display device, comprising the display substrate of claim 1.

13. A preparation method for a display substrate, wherein:
the display substrate comprises a substrate and a plurality of sub-pixels disposed on the substrate, at least one of the plurality of sub-pixels comprises a pixel drive circuit and a light emitting element electrically connected to the pixel drive circuit; the pixel drive circuit comprises a plurality of transistors and at least one storage capacitor;

the preparation method comprises:
sequentially forming a semiconductor layer, a first metal layer, a second metal layer, a third metal layer and a fourth metal layer on the substrate; the semiconductor layer comprises active layers of the plurality of transistors; the first metal layer at least comprises a scan line extending in a first direction, gate electrodes of the plurality of transistors, and a first capacitor plate of the storage capacitor; the second metal layer at least comprises a scan connection line extending along the first direction; an insulating layer between the second metal layer and the first metal layer is provided with a first via, and the scan connection line is in contact with the scan lines exposed through the first via; the third metal layer at least comprises a second capacitor plate of the storage capacitor; the fourth metal layer at least comprises a data line extending in a second direction perpendicular to the first direction and a source electrodes and drain electrodes of the plurality of transistors; and the scan line comprises a first part and a second part connected in sequence along a first direction, a projection of the first part on the substrate is overlapped with a projection of the fourth metal layer on the substrate, a projection of the second part on the substrate is not overlapped with the projection of the fourth metal layer on the substrate, and an average length of the second part in the second direction is greater than an average length of the first part in the second direction;

the pixel drive circuit comprises a first transistor, a second transistor, a third transistor, a fourth transistor, a fifth transistor and a storage capacitor;

a gate electrode of the first transistor is connected to a second electrode of the third transistor, the first capacitor plate of the storage capacitor and a second electrode of the fourth transistor, a first electrode of the first transistor is connected to a second electrode of the second transistor, a second electrode of the first transistor is connected to the second capacitor plate of the storage capacitor, a first electrode of the fifth transistor and a first electrode of the light emitting element;

a gate electrode of the second transistor is connected to an emitting control line, and a first electrode of the second transistor is connected to a first power supply line;

a gate electrode of the third transistor is connected to a first control signal line, and a first electrode of the third transistor is connected to a reference voltage line;

a gate electrode of the fourth transistor is connected to the scan line, and a first electrode of the fourth transistor is connected to the data line; and a gate electrode of the fifth transistor is connected to a second control signal line, and a second electrode of the fifth transistor is connected to an initial voltage line;

the third transistor, the fourth transistor, and the fifth transistor are double gate transistors;

each double gate transistor comprises two gate electrodes connected to each other; and the first capacitor plate of the storage capacitor and the gate electrode of the first transistor are integrally structured.

* * * * *